US012777777B2

(12) United States Patent

Bok et al.

(10) Patent No.: US 12,777,777 B2

(45) Date of Patent: Oct. 27, 2026

(54) ELECTRONIC DEVICE INCLUDING PATTERNS ON PIXEL DEFINITION LAYER

(71) Applicant: Samsung Display Co., LTD., Yongin-si (KR)

(72) Inventors: Seung-Lyong Bok, Hwaseong-si (KR); Eunhye Kang, Hwaseong-si (KR); Joohyun Kang, Suwon-si (KR); Ohjune Kwon, Hwaseong-si (KR); Kyujin Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 780 days.

(21) Appl. No.: 18/072,518

(22) Filed: Nov. 30, 2022

(65) Prior Publication Data

US 2023/0189574 A1 Jun. 15, 2023

(30) Foreign Application Priority Data

Dec. 10, 2021 (KR) ........................ 10-2021-0176992

(51) Int. Cl.

| | |
|---|---|
| ***H10K 59/12*** | (2023.01) |
| ***H10K 50/844*** | (2023.01) |
| ***H10K 59/122*** | (2023.01) |
| ***H10K 59/40*** | (2023.01) |
| ***H10K 77/10*** | (2023.01) |
| *G06F 1/16* | (2006.01) |
| *H10K 102/00* | (2023.01) |

(52) U.S. Cl.

CPC ......... *H10K 59/122* (2023.02); *H10K 50/844* (2023.02); *H10K 59/12* (2023.02); *H10K 59/40* (2023.02); *H10K 77/111* (2023.02); *G06F 1/1652* (2013.01); *H10K 2102/311* (2023.02)

(58) Field of Classification Search

CPC .... H10K 59/122; H10K 59/40; H10K 59/352; H10K 59/131; H10K 59/124; H10K 59/12; H10K 50/844; H10K 77/111; G06F 1/1652; G09F 9/301; G09F 9/335

See application file for complete search history.

(56) References Cited

U.S. PATENT DOCUMENTS

| | | | | |
|---|---|---|---|---|
| 10,068,809 | B2 * | 9/2018 | Zhou .................. | H10D 86/0223 |
| 10,355,232 | B2 | 7/2019 | Heo et al. | |
| 10,516,004 | B2 | 12/2019 | Park et al. | |

(Continued)

FOREIGN PATENT DOCUMENTS

| | | | | |
|---|---|---|---|---|
| CN | 206250196 U | * 6/2017 | ............. | H05B 33/04 |
| CN | 112420959 A | * 2/2021 | ............. | H10K 59/65 |

(Continued)

*Primary Examiner* — Ida M Soward

(74) *Attorney, Agent, or Firm* — Womble Bond Dickinson (US) LLP

(57) ABSTRACT

An electronic device includes a base layer, a plurality of first electrodes on the base layer, a pixel definition layer on the first electrodes and including a plurality of openings that expose a portion of the first electrodes, a plurality of light emitting layers on the first electrodes, a plurality of patterns on the pixel definition layer, a second electrode on the light emitting layers, and an encapsulation layer on the patterns and the second electrode. The patterns are disposed between the light emitting layers when viewed in a plane, and each of the patterns has a width from about 3 micrometers to about 4 micrometers.

20 Claims, 26 Drawing Sheets

(56) References Cited

U.S. PATENT DOCUMENTS

| | | | | |
|---|---|---|---|---|
| 10,727,439 | B2 | 7/2020 | Lim | |
| 11,672,156 | B2 | 6/2023 | Lee et al. | |
| 12,058,895 | B2 * | 8/2024 | Lee | H10K 59/8052 |
| 2005/0237780 | A1 * | 10/2005 | Sakai | H10K 59/80523<br>365/111 |
| 2010/0051992 | A1 * | 3/2010 | Kobayashi | H10K 59/173<br>257/40 |
| 2012/0097987 | A1 * | 4/2012 | Ryu | H10K 59/131<br>257/E51.018 |
| 2016/0254476 | A1 * | 9/2016 | Park | H10K 59/352<br>257/40 |
| 2016/0300894 | A1 * | 10/2016 | Park | H10K 59/122 |
| 2017/0155075 | A1 * | 6/2017 | Bi | H10K 59/35 |
| 2018/0090549 | A1 * | 3/2018 | Hamada | H10K 59/38 |
| 2019/0212780 | A1 * | 7/2019 | Choi | G09F 9/301 |
| 2019/0288231 | A1 * | 9/2019 | He | H10K 59/122 |
| 2020/0119114 | A1 * | 4/2020 | Kim | H10K 59/80522 |
| 2020/0144540 | A1 | 5/2020 | Lee et al. | |
| 2020/0168670 | A1 * | 5/2020 | Kim | H10K 59/1213 |
| 2020/0168823 | A1 | 5/2020 | Kim | |
| 2020/0235172 | A1 * | 7/2020 | Lee | G06F 3/0443 |
| 2021/0066419 | A1 * | 3/2021 | Byun | H10K 59/122 |
| 2021/0066642 | A1 * | 3/2021 | Lee | H10K 59/124 |
| 2021/0280647 | A1 * | 9/2021 | Han | H10K 59/353 |
| 2021/0408163 | A1 * | 12/2021 | Heo | H10K 59/353 |
| 2022/0149136 | A1 * | 5/2022 | Lee | H10K 59/1213 |
| 2022/0310721 | A1 * | 9/2022 | Ma | H10K 59/122 |

FOREIGN PATENT DOCUMENTS

| | | | | |
|---|---|---|---|---|
| EP | 1942526 | A2 * | 7/2008 | H10K 59/12 |
| KR | 10-2018-0024886 | A | 3/2018 | |
| KR | 10-2018-0079059 | A | 7/2018 | |
| KR | 10-2019-0057550 | A | 5/2019 | |
| KR | 10-2019-0066326 | A | 6/2019 | |
| KR | 10-2020-0051150 | A | 5/2020 | |
| KR | 10-2020-0059814 | A | 5/2020 | |
| KR | 10-2020-0063590 | A | 6/2020 | |
| KR | 10-2021-0060711 | A | 5/2021 | |
| KR | 10-2021-0114094 | A | 9/2021 | |
| WO | WO-2021212313 | A1 * | 10/2021 | H10K 59/873 |

* cited by examiner

ELECTRONIC DEVICE INCLUDING PATTERNS ON PIXEL DEFINITION LAYER

CROSS-REFERENCE TO RELATED APPLICATION

This application claims priority to and the benefit of Korean Patent Application No. 10-2021-0176992, filed on Dec. 10, 2021, the content of which is hereby incorporated by reference in its entirety.

BACKGROUND

1. Field

The present disclosure relates to an electronic device capable of reducing a separation phenomenon between a light emitting element layer and an encapsulation layer.

2. Description of the Related Art

Electronic devices, such as televisions, monitors, smart phones, and tablet computers, that provide images to a user include a display panel displaying the images. Examples of such display panels may include a liquid crystal display panel, an organic light emitting display panel, an electrowetting display panel, and an electrophoretic display panel.

Because an organic light emitting display panel does not require a separate light source, the organic light emitting display panel has an advantage of being able to be used as a curved or flexible electronic device.

A light emitting element layer of the organic light emitting display panel is particularly sensitive to moisture and oxygen. The organic light emitting display panel includes an encapsulation layer with one or more layers on the organic light emitting element to prevent or reduce moisture permeation and oxygen permeation.

However, because the encapsulation layer has a relatively low adhesive strength compared with other elements of the organic light emitting display panel, the encapsulation layer is likely to be separated from other elements when being bent.

SUMMARY

Aspects of embodiments of the present disclosure are directed toward an electronic device capable of reducing a separation phenomenon between a light emitting element layer and an encapsulation layer.

Embodiments of the present disclosure provide an electronic device including a base layer, a plurality of first electrodes disposed on the base layer, a pixel definition layer disposed on the first electrodes and provided with a plurality of openings defined therethrough to expose a portion of the first electrodes, respectively, a plurality of light emitting layers respectively disposed on the first electrodes, a plurality of patterns disposed on the pixel definition layer, a second electrode disposed on the light emitting layers, and an encapsulation layer disposed on the patterns and the second electrode. The patterns are disposed between the light emitting layers when viewed in a plane.

Each of the patterns has a width from about 3 micrometers to about 4 micrometers.

A gap between the patterns is within a range from about 1.5 micrometers to about 4.5 micrometers, and a thickness of each of the patterns is within a range from about 1 micrometer to about 2 micrometers.

The base layer includes a first area whose shape varies and a second area defined adjacent to the first area, and the patterns overlap the first area and do not overlap the second area when viewed in the plane.

The base layer includes a first area folded and unfolded with respect to a folding axis extending in a first direction and a second area defined adjacent to the first area, each of the patterns extends in a first cross direction crossing the first direction, and the patterns are spaced apart from each other in a second cross direction crossing the first cross direction.

The encapsulation layer covers the second electrode and the patterns.

The second electrode includes a first electrode portion disposed on an upper surface of each of the patterns and a second electrode portion spaced apart from the first electrode portion and disposed on the light emitting layers.

Each of the patterns has a reverse taper shape.

The second electrode includes a first electrode portion and a plurality of second electrode portions, the first electrode portion is disposed on the light emitting layer, the first electrode portion is provided with a plurality of openings that does not overlap the patterns when viewed in the plane, and the second electrode portions respectively overlap the openings when viewed in the plane.

The electronic device further includes a spacer disposed between the patterns and the light emitting layers when viewed in the plane. The spacer includes a first portion and a second portion, and each of the first portion and the second portion has a width from about 9 micrometers to about 13 micrometers.

A gap between the first portion and the second portion is within a range from about 1.5 micrometers to about 4.5 micrometers.

Each of the first portion and the second portion has a thickness from about 2.3 micrometers to about 3.3 micrometers.

Embodiments of the present disclosure provide an electronic device including a base layer including a folding area folded or unfolded with respect to a folding axis extending in a first direction and a plurality of non-folding areas spaced apart from each other with the folding area interposed there between, a circuit layer disposed on the base layer and including a transistor and an insulating layer, a light emitting element layer disposed on the circuit layer and including a light emitting element including a first electrode, a light emitting layer, and a second electrode, a pixel definition layer, and a plurality of patterns disposed on the pixel definition layer, and an encapsulation layer disposed on the light emitting element layer. The patterns overlap the folding area when viewed in a plane, and each of the patterns has a thickness from about 1 micrometer to about 2 micrometers.

Each of the patterns has a width from about 3 micrometers to about 4 micrometers when viewed in the plane.

A gap between the patterns is within a range from about 1.5 micrometers to about 4.5 micrometers.

The patterns do not overlap the non-folding areas when viewed in the plane.

Each of the patterns extends in a first cross direction crossing the first direction, and the patterns are spaced apart from each other in a second cross direction crossing the first cross direction.

The encapsulation layer covers the second electrode and the patterns.

Each of the patterns includes a side surface spaced apart from the second electrode.

Each of the patterns has a reverse taper shape.

According to the above, portions of the second electrode are disconnected due to the patterns, and thus, a resistance of the second electrode increases. A current leakage through the second electrode is prevented or reduced. Accordingly, a reliability of the electronic device is improved.

According to the above, the patterns are designed to have a shape suitable to prevent or reduce a separation phenomenon. The separation phenomenon of the encapsulation layer is prevented or reduced due to the width and the thickness of each of the patterns, and the distance between the patterns. Accordingly, the reliability of the electronic device is improved.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1A:
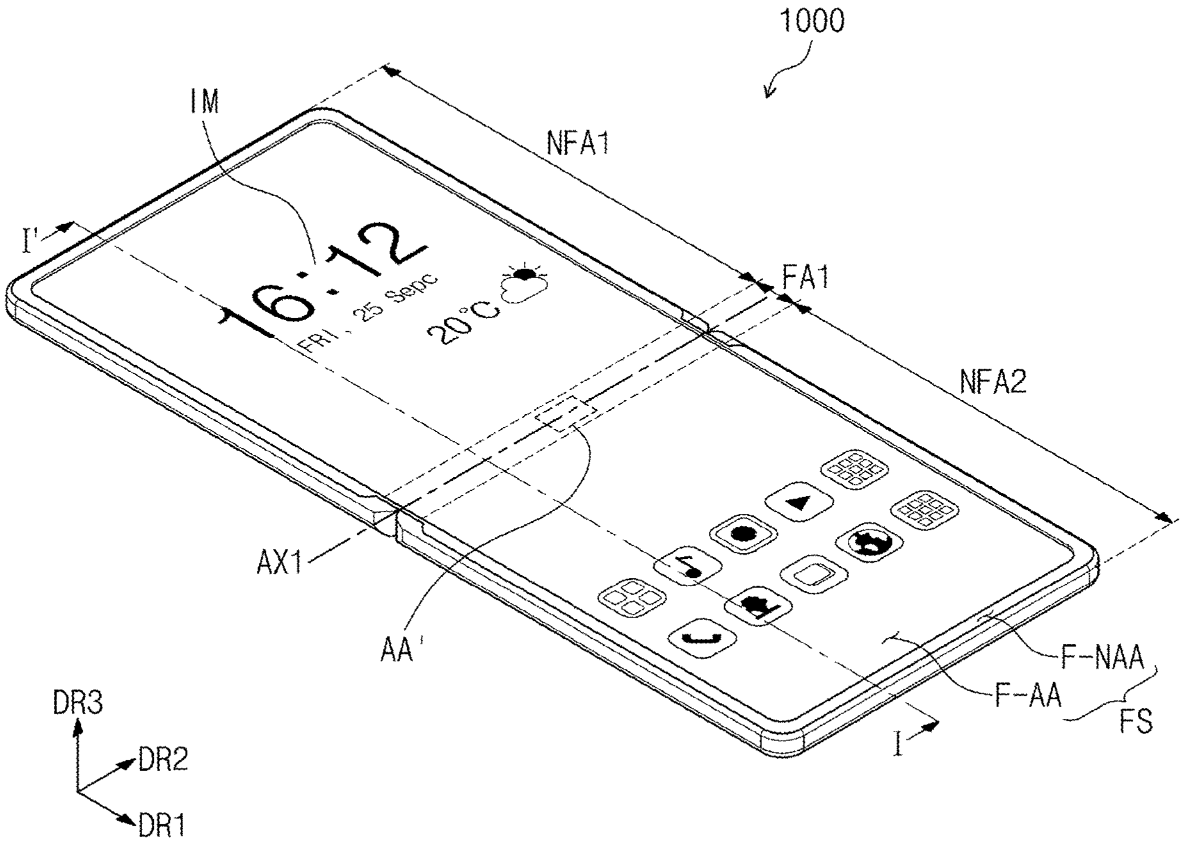
FIG. 1A is a perspective view showing an electronic device in an unfolded state according to an embodiment of the present disclosure.

In the present disclosure, it will be understood that when an element (or area, layer, or portion) is referred to as being "on", "connected to" or "coupled to" another element or layer, it can be directly on, connected or coupled to the other element or layer or intervening element(s) or layer(s) may be present.

Like numerals refer to like elements throughout, and duplicative descriptions thereof may not be provided. In the drawings, the thickness, ratio, and dimension of components are exaggerated for effective description of the technical content (e.g., amount). As used herein, the term "and/or" may include any and all combinations of one or more of the associated listed items.

It will be understood that, although the terms first, second, etc. may be used herein to describe one or more suitable elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and/or the like, may be used herein for ease of description to describe one element or feature's relationship to another elements or features as shown in the drawings.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to accompanying drawings.

Figure 1B:
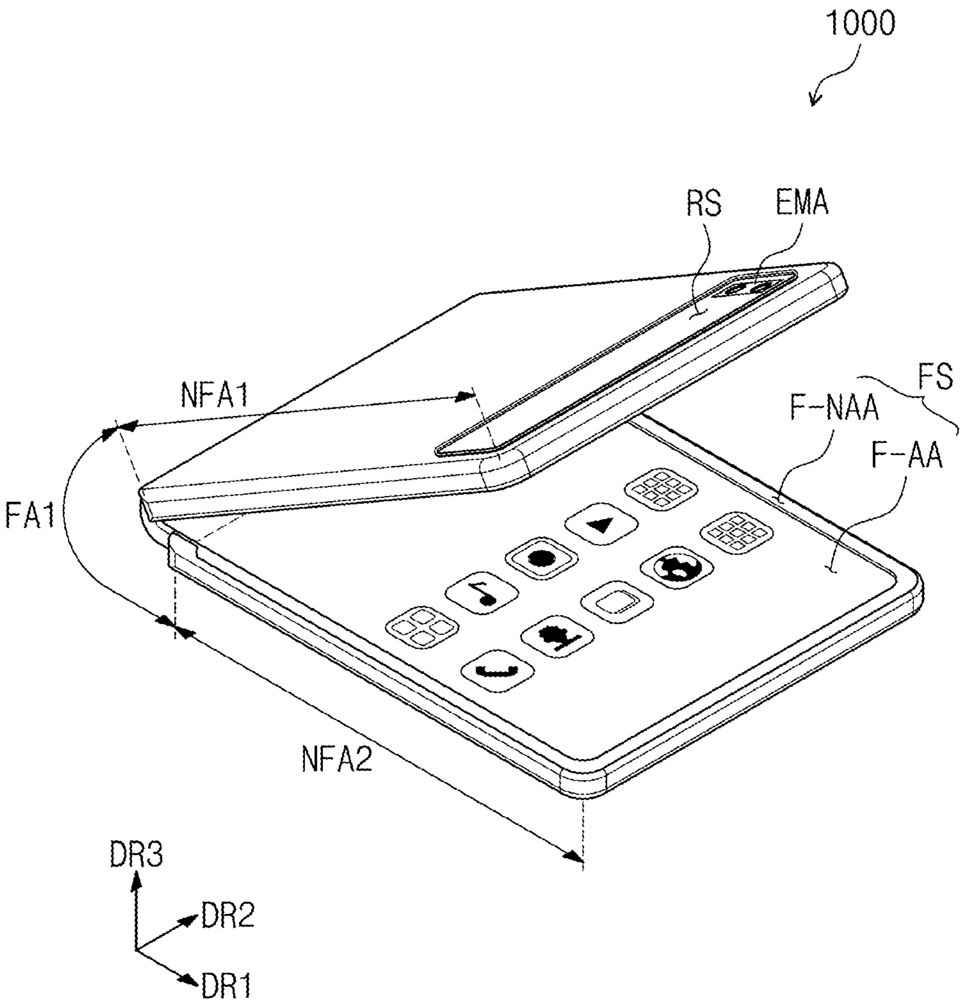
FIG. 1B is a perspective view showing the electronic device shown in FIG. 1A in the midst of an in-folding process according to an embodiment of the present disclosure.

FIG. 1A is a perspective view showing an electronic device 1000 in an unfolded state according to an embodiment of the present disclosure. FIG. 1B is a perspective view showing the electronic device 1000 shown in FIG. 1A in the midst of an in-folding process according to an embodiment of the present disclosure.

Referring to FIGS. 1A and 1B, the electronic device 1000 may be a device that is activated in response to an electrical signal. The electronic device 1000 may include one or more suitable embodiments. For example, the electronic device 1000 may include a tablet computer, a notebook computer, a computer, a smart television, and/or the like. In the present embodiment, a foldable smartphone will be described as a representative example of the electronic device 1000.

The electronic device 1000 may display an image IM through a first display surface FS, which is substantially parallel to each of a first direction DR1 and a second direction DR2, toward a third direction DR3 (e.g., display the image IM in a plan view). The display surface FS through which the image IM is displayed may correspond to a front surface of the electronic device 1000. The image IM may include a still image as well as a video. FIG. 1A shows an internet search box and a clock widget as a representative example of the image IM.

In the present embodiment, front (or upper) and rear (or lower) surfaces of each member of the electronic device 1000 may be defined with respect to a direction in which the image IM is displayed. The front and rear surfaces may be opposite to each other in the third direction DR3, and a line normal (e.g., perpendicular) to a direction of each of the front and rear surfaces may be substantially parallel to the third direction DR3.

A separation distance in the third direction DR3 between the front surface and the rear surface may correspond to a thickness or a height of the electronic device 1000 in the third direction DR3. In some embodiments, directions indicated by the first, second, and third directions DR1, DR2, and DR3 are relative to each other and may be changed to other directions.

The electronic device 1000 may sense an external input applied thereto from the outside. The external input may include inputs of one or more suitable forms provided from the outside of the electronic device 1000. As an example, the external input may include external inputs applied when in close proximity to or approaching close to the electronic device 1000 at a set or predetermined distance (e.g., a hovering input) as well as a touch input by a user's body (e.g., a hand of a user). In some embodiments, the external input may include one or more suitable forms, such as force, pressure, temperature, or light.

The electronic device 1000 according to the present embodiment may include the first display surface FS and a second display surface RS. The first display surface FS may include a first active area F-AA and a first peripheral area F-NAA.

The first active area F-AA may be activated in response to the electrical signal. The image IM may be displayed through the first active area F-AA, and one or more suitable external inputs may be sensed through the first active area F-AA. The first peripheral area F-NAA may be defined as being adjacent to the first active area F-AA. The first peripheral area F-NAA may have a set or predetermined color. The first peripheral area F-NAA may be around (e.g., may surround) the first active area F-AA. Accordingly, the first active area F-AA may have a shape that is substantially defined by the first peripheral area F-NAA, however, this is merely an example. The first peripheral area F-NAA may be defined as being adjacent to only one side of the first active area F-AA or may not be provided. The electronic device 1000 according to an embodiment may include active areas of one or more suitable shapes and should not be particularly limited.

The second display surface RS may be opposite to at least a portion of the first display surface FS. For example, the second display surface RS may be defined as a portion of the rear surface of the electronic device 1000. The second display surface RS may include an electronic module area EMA.

Various electronic modules may be disposed in the electronic module area EMA. For example, the electronic module may include at least one of a camera, a speaker, an optical sensor, or a thermal sensor. The electronic module area EMA may sense an external subject through the first and second display surfaces FS and RS. The electronic module may include a plurality of suitable components, however, it should not be limited to a particular embodiment.

The electronic device 1000 may be inwardly or outwardly folded (e.g., in-folding or out-folding) about a folding axis AX1. The folding axis AX1 may extend in the second direction DR2. For example, the folding axis AX1 may extend along a minor axis of the electronic device 1000.

A plurality of areas may be defined in the electronic device 1000 according to an operation type or kind of the electronic device 1000. The areas may include a folding area FA1 and at least one non-folding area NFA1 and NFA2. The folding area FA1 may be defined between two non-folding areas NFA1 and NFA2.

The folding area FA1 may be an area folded about the folding axis AX1 and substantially forming a curvature. The folding area FA1 may be flexible. The folding area FA1 may overlap a first area defined in a base layer 110 (refer to FIG. 7).

The non-folding areas NFA1 and NFA2 may include a first non-folding area NFA1 and a second non-folding area NFA2. The first non-folding area NFA1 may be disposed adjacent to one side of the folding area FA1, and the second non-folding area NFA2 may be disposed adjacent to the other side of the folding area FA1. Each of the first and second non-folding areas NFA1 and NFA2 may overlap a second area defined in the base layer 110.

In the present embodiment, the electronic device 1000 may include one folding area FA1 defined therein, however, the present disclosure should not be limited thereto or thereby. According to various embodiments, the electronic device 1000 may include a plurality of folding areas defined therein.

In a non-folded state of the electronic device 1000, the first display surface FS may be viewed by the user, and in an in-folded state, the second display surface RS may be viewed by the user.

Figure 2A:
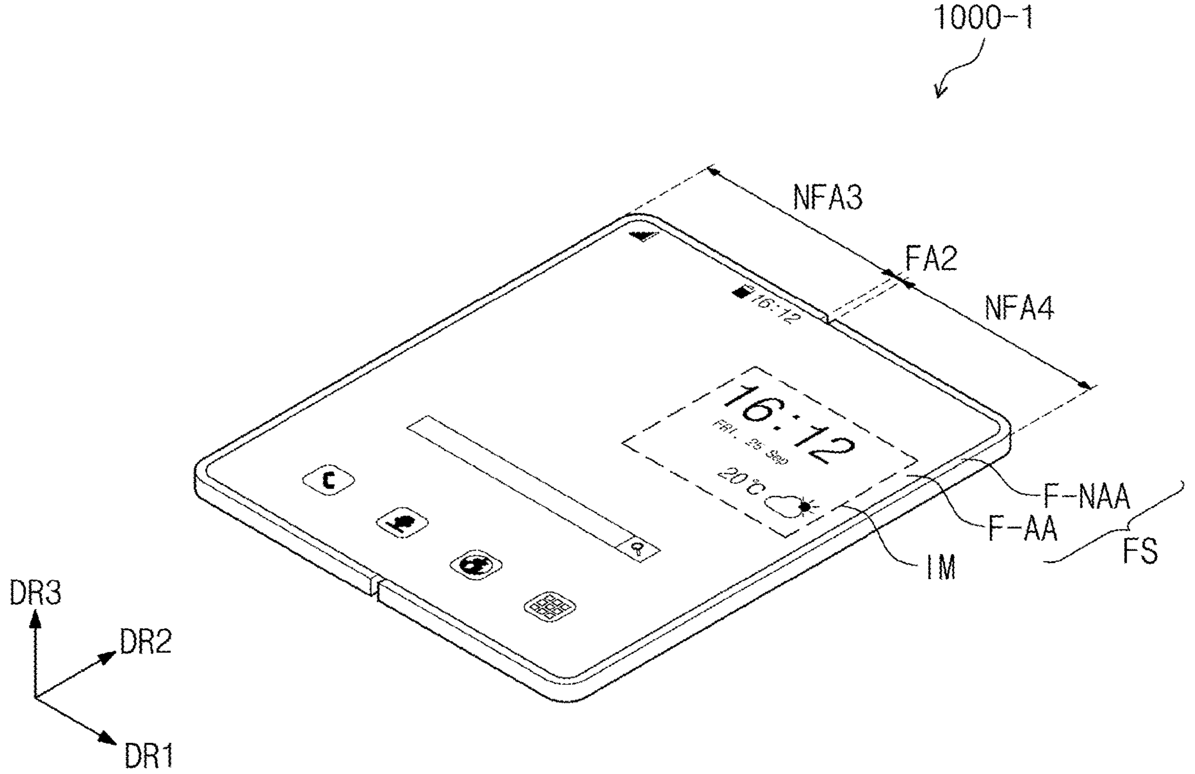
FIG. 2A is a perspective view showing an electronic device in an unfolded state according to an embodiment of the present disclosure.
Figure 2B:
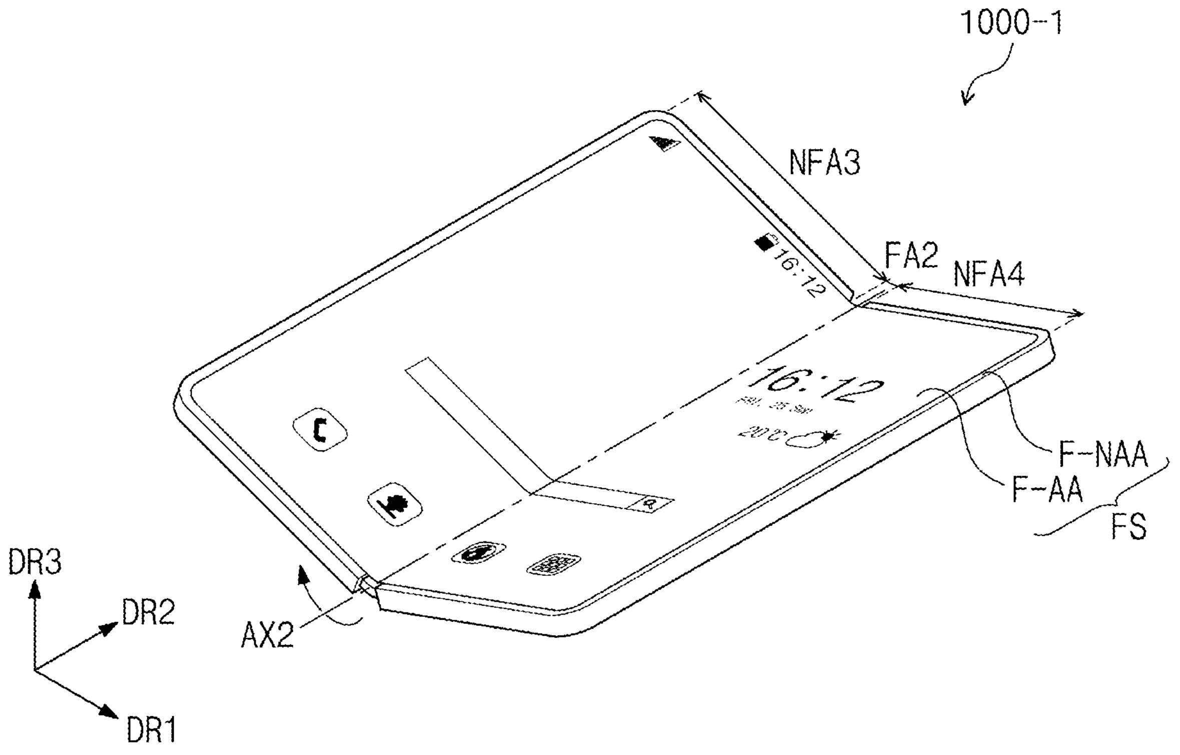
FIG. 2B is a perspective view showing the electronic device shown in FIG. 2A in the midst of an in-folding process according to an embodiment of the present disclosure.
Figure 2C:
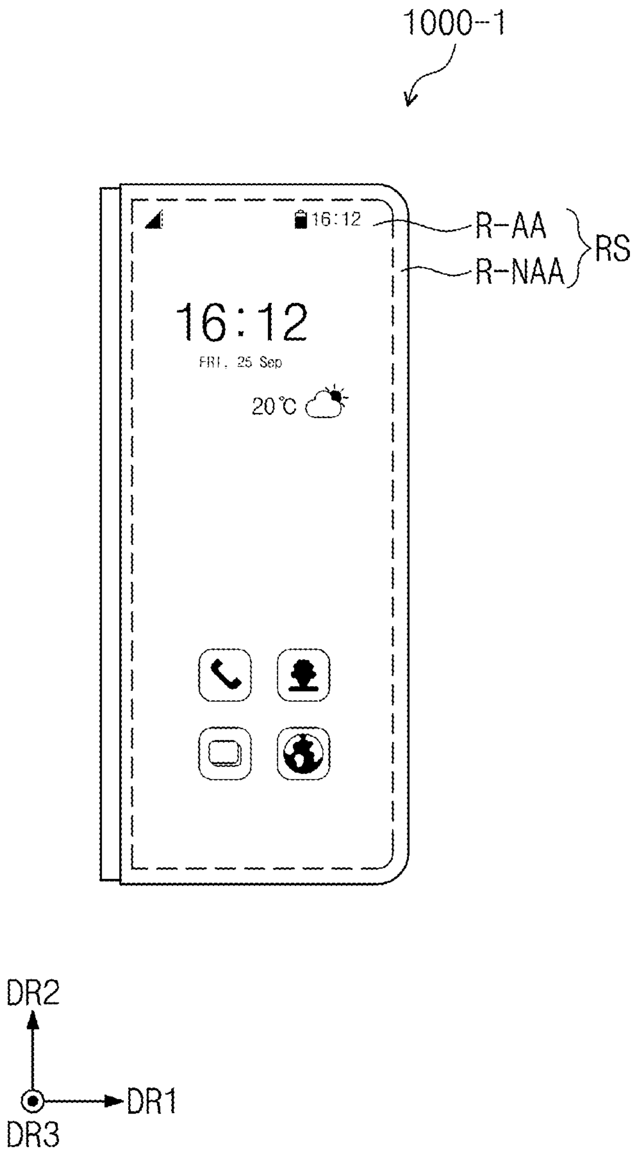
FIG. 2C is a plan view showing an electronic device shown in FIG. 2A in an in-folded state according to an embodiment of the present disclosure.
Figure 2D:
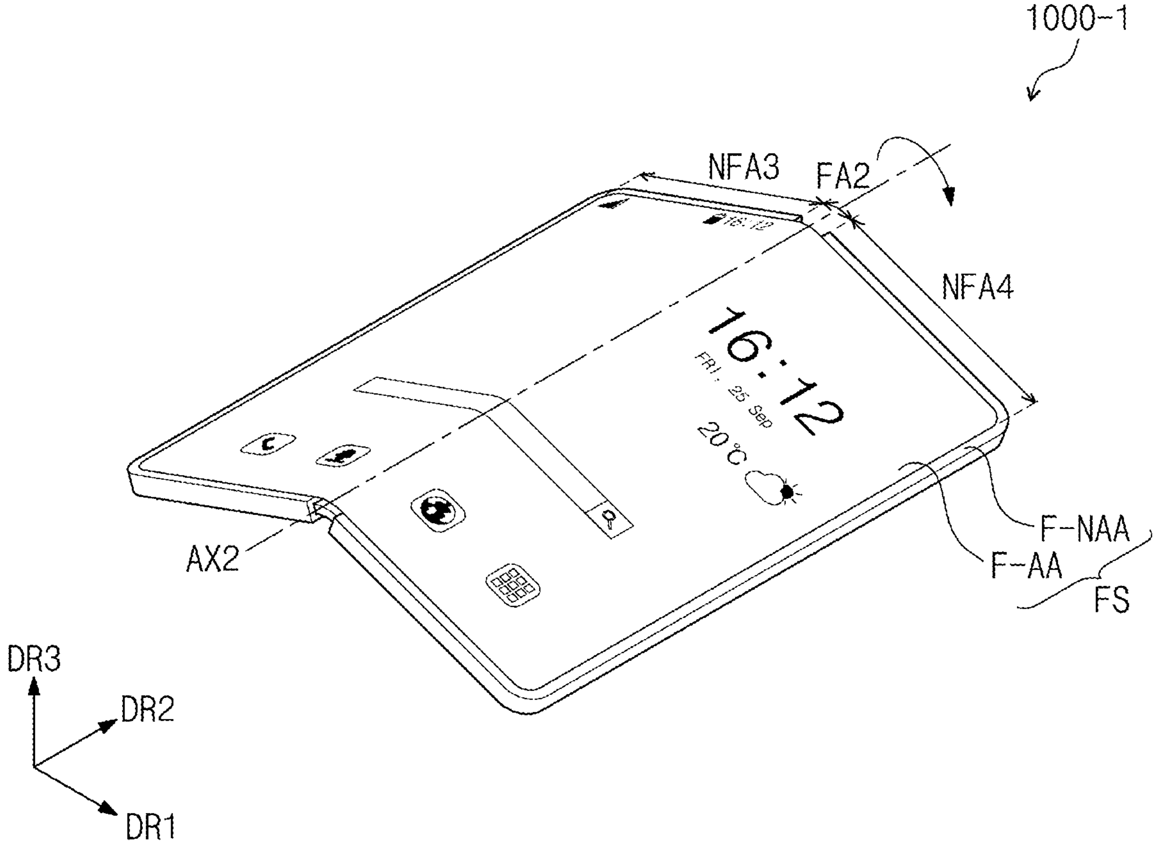
FIG. 2D is a perspective view showing an electronic device in the midst of an out-folding process according to an embodiment of the present disclosure.

FIG. 2A is a perspective view showing an electronic device 1000-1 in an unfolded state according to an embodiment of the present disclosure. FIG. 2B is a perspective view showing the electronic device 1000-1 shown in FIG. 2A in the midst of an in-folding process according to an embodiment of the present disclosure. FIG. 2C is a plan view showing the electronic device 1000-1 shown in FIG. 2A in an in-folded state according to an embodiment of the present disclosure. FIG. 2D is a perspective view showing the electronic device 1000-1 in the midst of an out-folding process according to an embodiment of the present disclosure.

Referring to FIG. 2A, the electronic device 1000-1 may include at least one folding area FA2 and a plurality of non-folding areas NFA3 and NFA4 extending from the folding area FA2. The non-folding areas NFA3 and NFA4 may be spaced apart from each other with the folding area FA2 interposed therebetween.

Referring to FIG. 2B, the electronic device 1000-1 may include a folding axis AX2 that extends in the second direction DR2 on a first display surface FS. For example, the folding axis AX2 may extend along a major axis of the electronic device 1000-1. The folding axis AX1 shown in FIGS. 1A and 1B may extend in a minor axis of the electronic device 1000, and the folding axis AX2 shown in FIGS. 2A to 2D may extend in a major axis of the electronic device 1000-1.

According to an embodiment, the non-folding areas NFA3 and NFA4 may be disposed adjacent to the folding area FA2 with the folding area FA2 interposed therebetween. For example, a first non-folding area NFA3 may be disposed adjacent to one side of the folding area FA2, and a second non-folding area NFA4 may be disposed adjacent to the other side of the folding area FA2.

The electronic device 1000-1 may be folded about the folding axis AX2 to be in an in-folded state where an area of the first display surface FS, which overlaps the first non-folding area NFA3, faces the other area of the first display surface FS, which overlaps the second non-folding area NFA4.

Referring to FIG. 2C, a second display surface RS may be viewed by a user during the in-folded state of the electronic device 1000-1. In this case, the second display surface RS may include a second active area R-AA through which the image is displayed and a second peripheral area R-NAA adjacent to the second active area R-AA. The second active area R-AA may be activated in response to an electrical signal. Additionally, the second active area R-AA may be an area through which the image is displayed and one or more suitable external inputs are sensed. The second peripheral area R-NAA may have a set or predetermined color. The second peripheral area R-NAA may be around (e.g., may surround) the second active area R-AA. In some embodiments, although not shown in drawings, the second display surface RS may further include an electronic module area in which an electronic module including one or more suitable components is disposed, but the second display surface RS should not be particularly limited.

Referring to FIG. 2D, the electronic device 1000-1 may be folded about the folding axis AX2 to be in an out-folding state where an area of the second display surface RS, which overlaps the first non-folding area NFA3, faces the other area of the second display surface RS, which overlaps the second non-folding area NFA4.

However, the electronic device 1000-1 should not be limited thereto or thereby. In some embodiments, the electronic device 1000-1 may be folded about a plurality of folding axes such that a portion of the first display surface FS and a portion of the second display surface RS may face each other, and the number of the folding axes and the number of non-folding areas should not be particularly limited.

Figure 3:
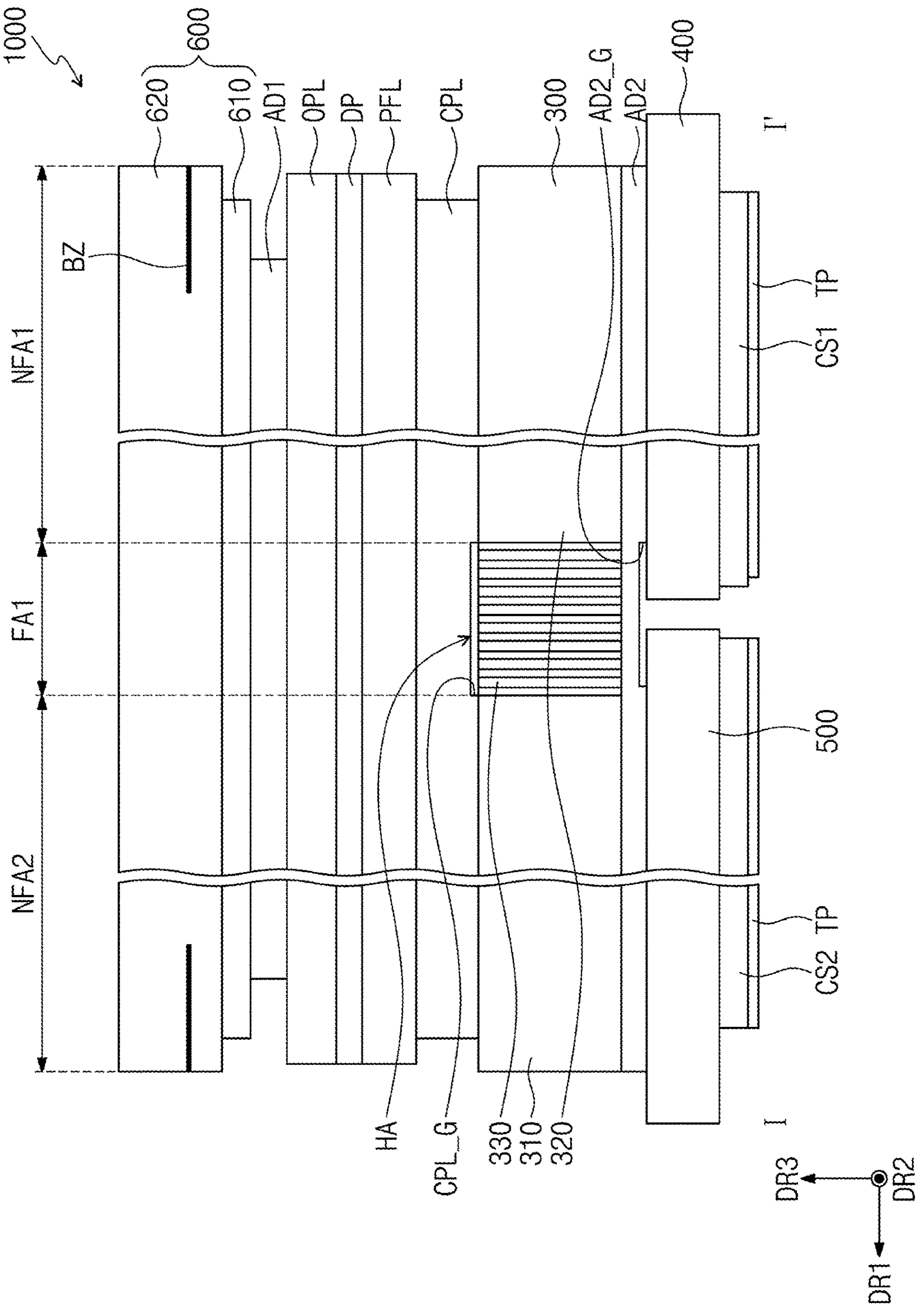
FIG. 3 is a cross-sectional view of an electronic device taken along a line I-I' of FIG. 1A according to an embodiment of the present disclosure.
Figure 4:
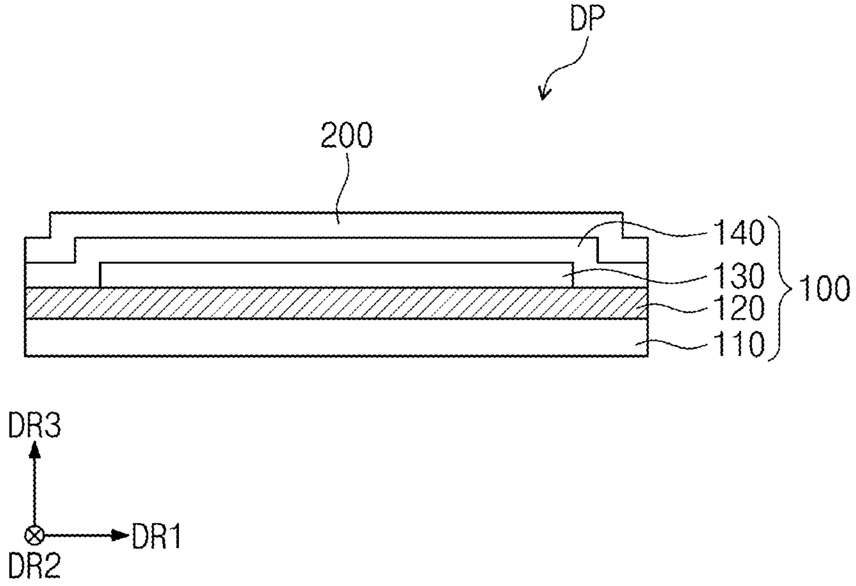
FIG. 4 is a cross-sectional view of a display panel according to an embodiment of the present disclosure.

FIG. 3 is a cross-sectional view of the electronic device 1000 taken along a line I-I' of FIG. 1A according to an embodiment of the present disclosure, and FIG. 4 is a cross-sectional view of a display panel DP according to an embodiment of the present disclosure.

Referring to FIGS. 3 and 4, the electronic device 1000 may include the display panel DP, a support plate 300, a first cushion layer CS1, a second cushion layer CS2, a first plate 400, a second plate 500, and a window 600 and may further include one or more suitable functional layers.

The display panel DP may be a flexible panel. The display panel DP may include a display layer 100 and a sensor layer 200. This will be described later in more detail. The display panel DP may have a thickness of about 40 μm.

The display layer 100 may be a light emitting type or kind display layer, however, it should not be particularly limited. For example, the display layer 100 may be an organic light emitting display layer, a quantum dot display layer, a micro-LED display layer, or a nano-LED display layer. A light emitting layer of the organic light emitting display layer may include an organic light emitting material. A light emitting layer of the quantum dot display layer may include a quantum dot or a quantum rod. A light emitting layer of the micro-LED display layer may include a micro-LED. A light emitting layer of the nano-LED display layer may include a nano-LED.

The display layer 100 may include a base layer 110, a circuit layer 120, a light emitting element layer 130, and an encapsulation layer 140.

The base layer 110 may provide a surface on which the circuit layer 120 is disposed. The base layer 110 may be a glass substrate, a metal substrate, or a polymer substrate. However, the embodiment should not be limited thereto or thereby, and according to an embodiment, the base layer 110 may be an inorganic layer, an organic layer, or a composite material layer.

The base layer 110 may have a multi-layer structure. For instance, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. In some embodiments, each of the first and second synthetic resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. In the present disclosure, the term "X-based resin", as used herein, refers to the resin that includes a functional group X.

The circuit layer 120 may be disposed on the base layer 110. The circuit layer 120 may include an insulating layer, a semiconductor pattern, a conductive pattern, and a signal line. An insulating layer, a semiconductor layer, and a conductive layer may be formed on the base layer 110 by a coating or depositing process. Then, the insulating layer, the semiconductor layer, and the conductive layer may be selectively patterned through several photolithography processes. Thus, the semiconductor pattern, the conductive pattern, and the signal line included in the circuit layer 120 may be formed.

The light emitting element layer 130 may be disposed on the circuit layer 120. The light emitting element layer 130 may include a light emitting element. For example, the light emitting element layer 130 may include an organic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from moisture, oxygen, and a foreign substance such as dust particles.

The sensor layer 200 may be formed on the display layer 100 through successive processes. In this case, the sensor layer 200 may be disposed directly on the display layer 100. In the following descriptions, the expression "the sensor layer 200 is disposed directly on the display layer 100" refers to that no intervening elements are present between the sensor layer 200 and the display layer 100. For example, a separate adhesive member may not be disposed between the sensor layer 200 and the display layer 100. In some embodiments, the sensor layer 200 may be coupled with the display layer 100 by an adhesive layer. The adhesive layer may be an adhesive.

An optical layer OPL may be disposed on the display panel DP. The optical layer OPL may reduce a reflectance with respect to an external light. The optical layer OPL may include a stretch-type or kind synthetic resin film. For example, the optical layer OPL may be formed by adsorbing iodine compound on a polyvinyl alcohol (PVA) film. According to an embodiment, the optical layer OPL may include a color filter. The optical layer OPL may include a variety of layers as long as the optical layer OPL may reduce the reflectance of the external light, and it should not be particularly limited.

The optical layer OPL and the window 600 may be coupled to each other by an adhesive layer AD1. The adhesive layer AD1 may include an optical clear adhesive (OCA), an optical clear resin (OCR), or a pressure sensitive adhesive (PSA). Additional adhesive layers described hereinafter may include the same material as the adhesive layer AD1. For example, the adhesive layer AD1 may have a thickness of about 50 μm.

The support plate 300 may be disposed under the display panel DP. The support plate 300 may support the display panel DP. The support plate 300 may include a first support portion 310, a second support portion 320, and a folding portion 330. The first support portion 310 and the second support portion 320 may be spaced apart from each other with the folding portion 330 interposed therebetween in the first direction DR1. In some embodiments, the support plate 300 may have a thickness greater than a thickness of the display panel DP. For example, the thickness of the support plate 300 may be about 150 μm.

When viewed in a plane, the first support portion 310 may overlap the second non-folding area NFA2.

When viewed in the plane (e.g., in a plan view), the second support portion 320 may overlap the first non-folding area NFA1.

Each of the first support portion 310 and the second support portion 320 may have an insulating property. As an example, each of the first support portion 310 and the second support portion 320 may be formed of a plastic or glass material.

The folding portion 330 may overlap the folding area FA1. A plurality of openings HA may be defined through the folding portion 330. The openings HA may be spaced apart from each other in the first direction DR1. In some embodiments, the folding portion 330 may have a lattice shape when viewed in a plane (e.g., in a plan view). As a size of each of the openings HA varies, a shape of the support plate 300 in the folding area FA may be changed. In some embodiments, the openings HA may be filled with a material with high flexibility.

The shape of the folding portion 330 may be suitably changed due to the openings HA when the support plate 300 is folded. The folding portion 330 may be formed of the same material as that of the first support portion 310 and the second support portion 320, however, this is one example. In other examples, the folding portion 330 may include a material different from that of the first support portion 310 and the second support portion 320. For example, the folding portion 330 may include a single metal or alloy. Accordingly, the folding portion 330 may stably protect the folding area of the display panel DP when folded.

A panel protective film PFL and a lower protective film CPL may be disposed between the display panel DP and the support plate 300.

The panel protective film PFL may be disposed under the display panel DP. The panel protective film PFL may protect a lower portion of the display panel DP. The panel protective film PFL may include a flexible plastic material. For example, the panel protective film PFL may include polyethylene terephthalate. In some embodiments, the panel protective film PFL may have a thickness greater than the thickness of the display panel DP. For example, the panel protective film PFL may have a thickness of about 68 μm.

The lower protective film CPL may be disposed under the panel protective film PFL. The lower protective film CPL may have a set or predetermined color. The lower protective film CPL may protect a rear surface of the display panel DP and may prevent or reduce the rear surface of the display panel DP from being viewed due to the light. The lower protective film CPL may include a material having high light absorption.

In some embodiments, the lower protective film CPL may be provided with a set or predetermined recessed portion CPL_G formed therein to overlap the folding area FA. Due to the recessed portion CPL_G, a thickness of the lower protective film CPL in the folding area FA may be reduced, and thus, a folding stress may be reduced. In some embodiments, an adhesive layer may be added to the recessed portion CPL_G, which may improve a coupling force between the lower protective film CPL and the support plate 300.

The first plate 400 may be disposed under the support plate 300. The first plate 400 may support the display panel DP. When viewed in a plane, the first plate 400 may overlap the first non-folding area NFA1.

The first plate 400 and the second plate 500 may face each other. The first plate 400 and the second plate 500 may be spaced apart from each other in the first direction DR1. When viewed in a plane, the first plate 400 and the second plate 500 may not overlap each other.

The first plate 400 may have a modulus of elasticity that is higher than that of the support plate 300. Accordingly, the first plate 400 may stably protect the display panel DP from external impacts. For example, the first plate 400 may include an aluminum alloy or a carbon fiber reinforcement plastic.

The first cushion layer CS1 and an insulating layer TP may be disposed under the first plate 400. When viewed in a plane (e.g., in a plan view), the first cushion layer CS1 may overlap the first plate 400.

The first cushion layer CS1 may absorb the external impacts to protect the display panel DP. The first cushion layer CS1 may include a foam sheet with a certain elasticity. For example, the first cushion layer CS1 may include sponge or polyurethane.

The insulating layer TP may be disposed under the first cushion layer CS1. The insulating layer TP may include an insulating film. The insulating layer TP may prevent or reduce static electricity from inflowing.

The second plate 500 may be disposed under the support plate 300. The second plate 500 may support the display panel DP. When viewed in a plane, the second plate 500 may overlap the second non-folding area NFA2.

The second plate 500 may have a modulus of elasticity that is higher than that of the support plate 300. Accordingly, the second plate 500 may stably protect the display panel DP from external impacts. For example, the second plate 500 may include an aluminum alloy or a carbon fiber reinforcement plastic.

The second cushion layer CS2 and the insulating layer TP may be disposed under the second plate 500. When viewed in a plane (e.g., in a plan view), the second cushion layer CS2 may overlap the second non-folding area NFA2.

The second cushion layer CS2 may absorb the external impacts to protect the display panel DP. The second cushion layer CS2 may include a foam sheet with a certain, set, or suitable elasticity. For example, the second cushion layer CS2 may include sponge or polyurethane.

The insulating layer TP may be disposed under the second cushion layer CS2. The insulating layer TP may include an insulating film. The insulating layer TP may prevent or reduce static electricity from inflowing.

The window 600 may be disposed on the display panel DP. The window 600 may provide an area that overlaps an active area of the display panel DP and is optically transparent. The window 600 may provide the first display surface FS (refer to FIG. 1A) of the electronic device 1000. The image IM displayed through the display panel DP may be viewed by the user through the window 600.

The window 600 may include a thin film glass or a synthetic resin film. When the window 600 includes the thin film glass, the window 600 may have a thickness equal to or smaller than about 100 μm. For example, the thickness of the window may be about 30 μm, however, it should not be limited thereto or thereby. When the window 600 includes the synthetic resin film, the window 600 may include a polyimide (PI) film or a polyethylene terephthalate (PET) film.

The window 600 may have a single-layer or multi-layer structure. For example, the window 600 may include a plurality of synthetic resin films coupled to each other by an adhesive or the glass substrate and the synthetic resin film coupled to the glass substrate by the adhesive. The window 600 may include a flexible material. Thus, the window 600 may be folded or unfolded about the folding axis AX1 (refer to FIG. 1A). For example, when the shape of the display panel DP is changed, the shape of the window 600 may be changed to correspond to the shape of the display panel DP.

The window 600 may transmit the image IM (refer to FIG. 1A) from the display panel DP and concurrently (e.g., simultaneously) may buffer the external impacts to prevent or reduce the display panel DP from being damaged or malfunctioning due to the external impacts. The external impacts may refer to external forces, such as pressure or stress, which cause defects in the display panel DP.

The optical layer OPL and the adhesive layer AD1 may be disposed between the window 600 and the display panel DP. The window 600 may include a first layer 610, a second layer 620, and a bezel pattern BZ. The first layer 610 may include a glass material. For example, the first layer 610 may have a thickness equal to or smaller than about 10 μm. Accordingly, the first layer 610 may be easily folded.

The second layer 620 may be disposed on the first layer 610. The second layer 620 may include a material having a modulus of elasticity lower than that of the first layer 610. For example, the second layer 620 may be a film including an organic material. The second layer 620 may have a thickness greater than that of the first layer 610. The second layer 620 may have a thickness equal to or smaller than about 105 μm. The second layer 620 may protect an upper surface of the first layer 610.

In some embodiments, the bezel pattern BZ may be inserted into the second layer 620, however, this is merely an example. According to an embodiment, the bezel pattern BZ may be disposed on a lower surface or an upper surface of the second layer 620. The bezel pattern BZ may be a colored pattern having a set or predetermined color or a reflective pattern. The bezel pattern BZ may define the first peripheral area F-NAA (refer to FIG. 1A) described above, however, this is merely an example. According to an embodiment, the bezel pattern BZ may not be provided from the window 600. According to another embodiment, the window 600 may be formed as a single layer or may further include other functional layers, but it should not be particularly limited.

In some embodiments, although not shown in FIG. 3, the electronic device 1000 may further include a protective layer disposed on the window 600. The protective layer may improve an impact resistance of the window 600 and may prevent or reduce the window 600 from shattering when damaged. The protective layer may include at least one of a urethane-based resin, an epoxy-based resin, a polyester-based resin, a polyether-based resin, an acrylate-based resin, an acrylonitrile-butadiene-styrene (ABS) resin, and a rubber. For example, the protective layer may include at least one of phenylene, polyethylene terephthalate (PET), polyimide (PI), polyamide (PA), polyethylene naphthalate (PEN), or polycarbonate (PC).

In some embodiments, the electronic device 1000 may further include one or more functional layers disposed between the display panel DP and the window 600. For example, the functional layer may be an anti-reflective layer that blocks the reflection of external light. The anti-reflective layer may prevent or reduce components included in the display panel DP from being viewed from the outside due to the external light incident through the front surface of the electronic device 1000. The anti-reflective layer may include a retarder, a polarizer, or a color filter.

Figure 5:
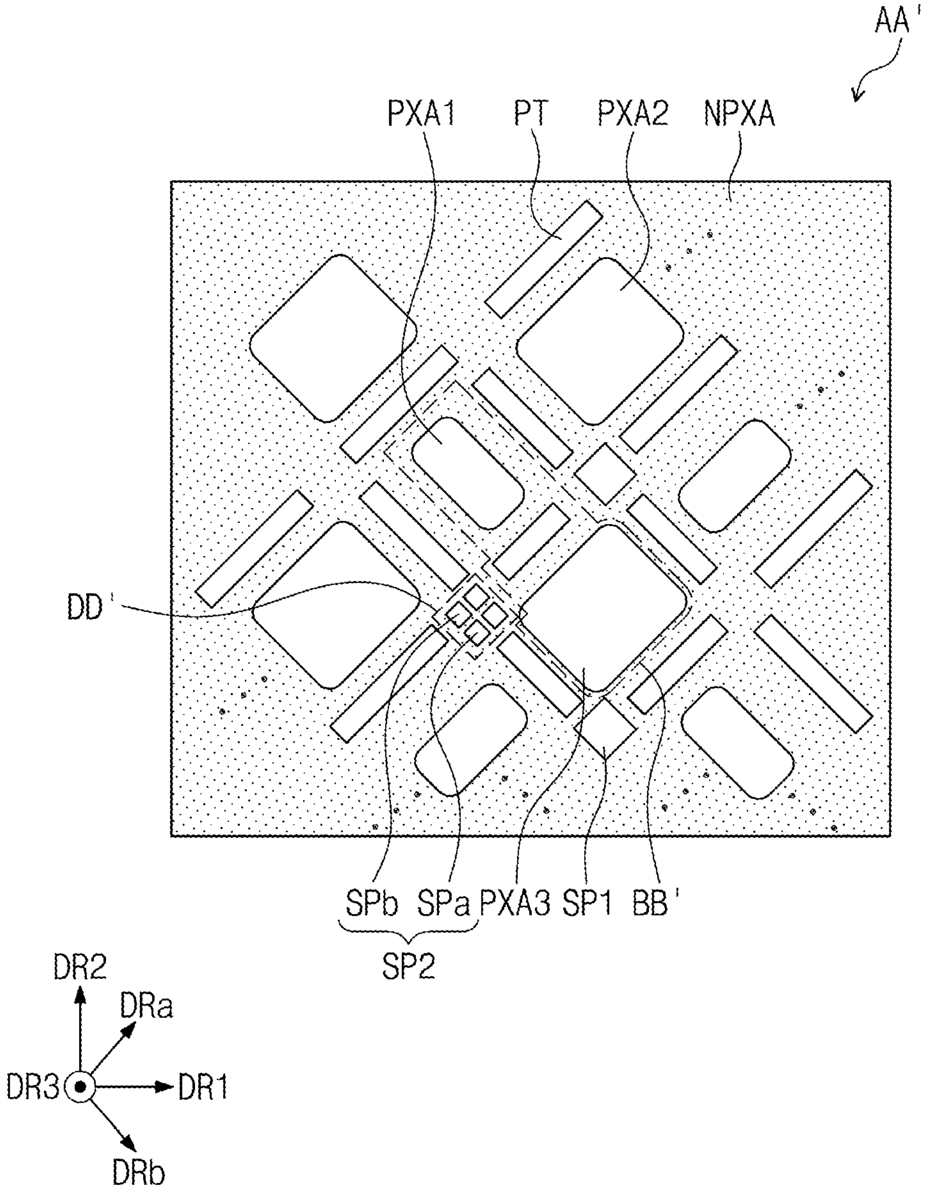
FIG. 5 is a plan view of an area AA' of FIG. 1A according to an embodiment of the present disclosure.

FIG. 5 is a plan view of an area AA' of FIG. 1A according to an embodiment of the present disclosure.

Referring to FIGS. 1A and 5, the area AA' of FIG. 5 may be a portion of the folding area FA1 of FIG. 1A. The display panel DP (refer to FIG. 4) may include a plurality of first light emitting areas PXA1, a plurality of second light emitting areas PXA2, a plurality of third light emitting areas PXA3, and a non-light-emitting area NPXA. The display panel DP (refer to FIG. 4) may provide a first color light through the first light emitting areas PXA1, may provide a second color light through the second light emitting areas PXA2, and may provide a third color light through the third light emitting areas PXA3. The first color light, the second color light, and the third color light may have different colors from each other. For example, the first color light may be a green light, the second color light may be a blue light, and the third color light may be a red light.

The first light emitting areas PXA1 may be spaced apart from each other with the respective second light emitting areas PXA2 interposed therebetween in a first cross direction DRa crossing the first direction DR1 and the second direction DR2.

The first light emitting areas PXA1 may be spaced apart from each other with the respective third light emitting areas PXA3 interposed therebetween in a second cross direction DRb crossing the first cross direction DRa.

Each of the first light emitting areas PXA1 may have a size smaller than a size of each of the second light emitting areas PXA2 and/or smaller than a size of each of the third light emitting areas PXA3.

Each of the second light emitting areas PXA2 may be disposed between four respective first light emitting areas PXA1.

The size of each of the second light emitting areas PXA2 may be greater than the size of each of the first light emitting areas PXA1 and/or greater than the size of each of the third light emitting areas PXA3.

Each of the third light emitting areas PXA3 may be disposed between four respective first light emitting areas PXA1.

The size of each of the third light emitting areas PXA3 may be greater than the size of each of the first light emitting areas PXA1 and/or may be smaller than the size of each of the second light emitting areas PXA2.

The non-light-emitting area NPXA may be disposed adjacent to the first light emitting areas PXA1, the second light emitting areas PXA2, and the third light emitting areas PXA3. The non-light-emitting area NPXA may define a boundary between the first light emitting areas PXA1, the second light emitting areas PXA2, and the third light emitting areas PXA3.

A plurality of patterns PT may be disposed between the first, second, and third light emitting areas PXA1, PXA2, and PXA3. The patterns PT may be disposed in the non-light-emitting area NPXA.

The patterns PT may be disposed in the folding area FA1. For example, the patterns PT may overlap the folding area FA1. The patterns PT may not be disposed in the non-folding areas NFA1 and NFA2. For example, the patterns PT may not overlap the non-folding areas NFA1 and NFA2.

A plurality of spacers SP1 and SP2 may be disposed between the patterns PT and the light emitting areas PXA1, PXA2, and PXA3.

The spacers SP1 and SP2 may include a first spacer SP1 and a second spacer SP2. The first spacer SP1 may be provided in plurality. The second spacer SP2 may be provided in plurality.

The first spacer SP1 may be spaced apart from the patterns PT, however, this is merely an example. The first spacer SP1 should not be limited thereto or thereby. For example, the first spacer SP1 may be provided integrally with the patterns PT.

The second spacer SP2 may include a first portion SPa and a second portion SPb. The second spacer SP2 may be arranged in an n by m matrix (each of n and m is a positive integer number). FIG. 5 shows the first portion SPa and the second portion SPb, which are arranged in two by two matrix as a representative example.

Figure 6:
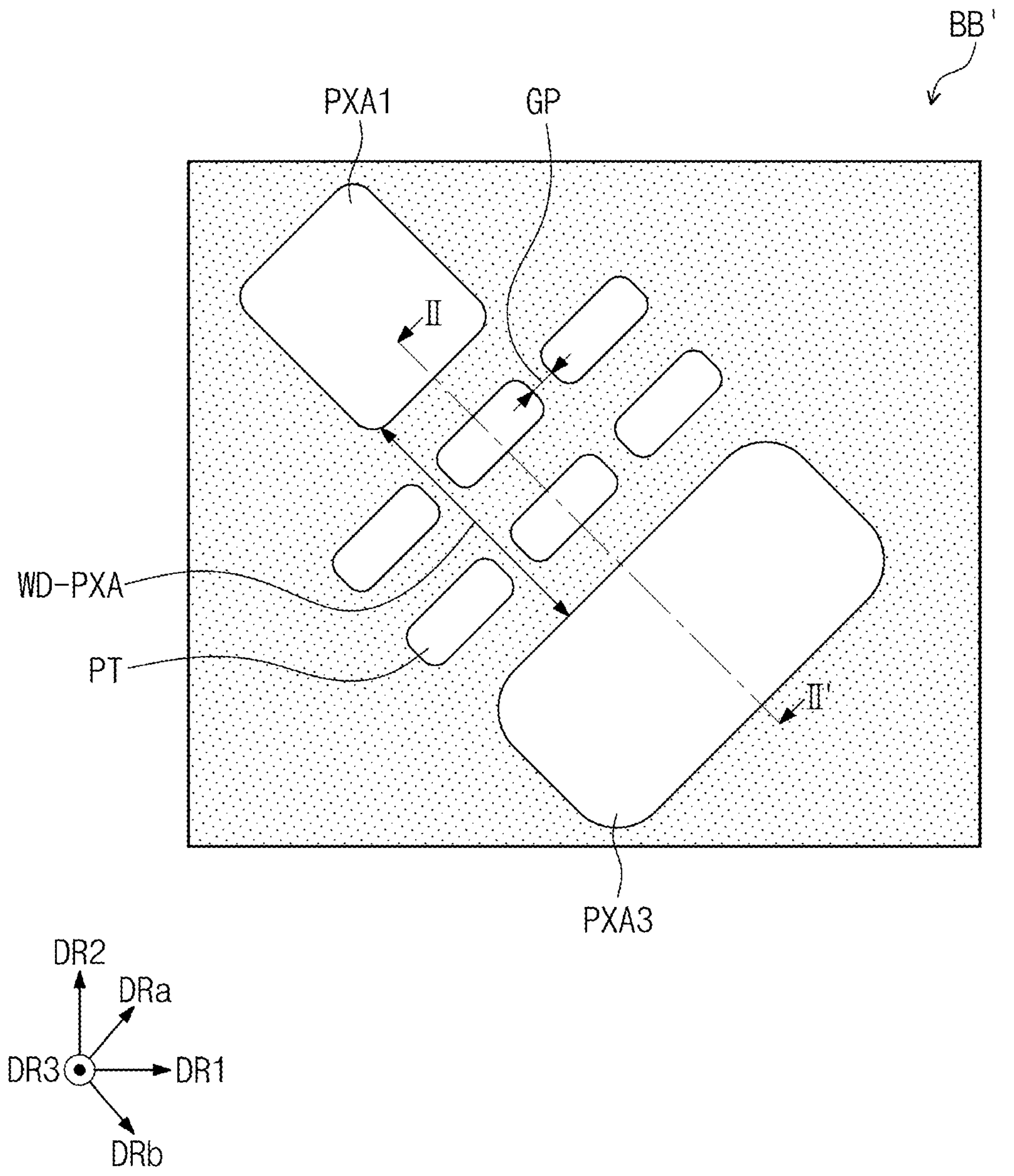
FIG. 6 is a plan view of an area BB' of FIG. 5 according to an embodiment of the present disclosure.

FIG. 6 is a plan view of an area BB' of FIG. 5 according to an embodiment of the present disclosure. In FIG. 6, the same reference numerals denote the same elements in FIG. 5, and thus, detailed descriptions of the same elements will not be provided.

Referring to FIG. 6, the patterns PT may be disposed between the first light emitting area PXA1 and the third light emitting area PXA3. A distance WD-PXA between the first light emitting area PXA1 and the third light emitting area PXA3 may be within a range from about 27 μm to about 32 μm.

Each of the patterns PT may extend in the first cross direction DRa. The patterns PT may be spaced apart from each other in the second cross direction DRb. The patterns PT may also be spaced apart from each other in the first cross direction DRa. The patterns PT may be arranged in an a by b (a×b) matrix (each of a and b is a positive integer number). FIG. 6 shows the patterns PT arranged in two by three (2×3) matrix as a representative example.

The patterns PT may be spaced apart from each other by a gap GP. The gap GP may be within a range from about 1.5 μm to about 4.5 μm.

Figure 7:
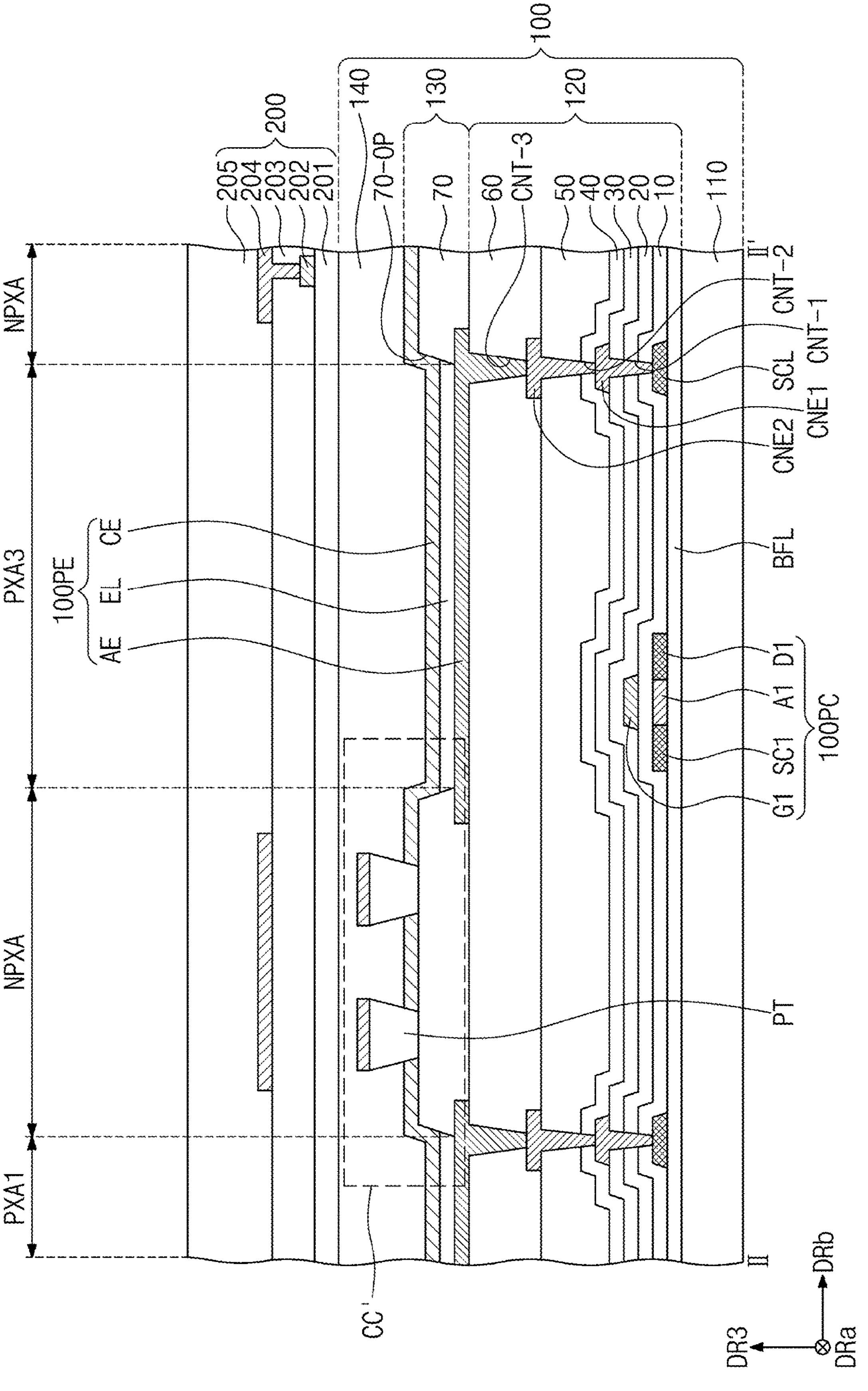
FIG. 7 is a cross-sectional view taken along a line II-II' of FIG. 6 according to an embodiment of the present disclosure.

FIG. 7 is a cross-sectional view taken along a line II-II' of FIG. 6 according to an embodiment of the present disclosure.

Referring to FIG. 7, the display layer 100 may include the base layer 110, the circuit layer 120, the light emitting element layer 130, and the encapsulation layer 140.

The base layer 110 may provide a base surface on which the circuit layer 120 is disposed. The base layer 110 may be a glass substrate, a metal substrate, or a polymer substrate. However, the embodiment should not be limited thereto or thereby, and according to an embodiment, the base layer 110 may be an inorganic layer, an organic layer, or a composite material layer. The base layer 110 may be flexible. The base layer 110 shown in FIG. 7 may be referred to as a first area. The first area of the base layer 110 may be an area in which the shape of the electronic device 1000 (refer to FIGS. 1A and 1B) is changed. In some embodiments, a second area may be further defined in the base layer 110 to be adjacent to the first area.

The base layer 110 may have a multi-layer structure. For instance, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. In some embodiments, each of the first and second synthetic resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. In the present disclosure, the term "X-based resin", as used herein, refers to the resin that includes a functional group of X.

At least one inorganic layer may be formed on an upper surface of the base layer 110. The inorganic layer may include at least one of aluminum oxide, titanium oxide, silicon oxide, silicon nitride, silicon oxynitride, zirconium oxide, or hafnium oxide. The inorganic layer may be formed in multiple layers. The inorganic layers formed in multiple layers may form a barrier layer and/or a buffer layer. In the present embodiment, the display layer 100 may include a buffer layer BFL.

The buffer layer BFL may increase an adhesion between the base layer 110 and a semiconductor pattern. The buffer layer BFL may include at least one of a silicon oxide layer, a silicon nitride layer, and a silicon oxynitride layer. For example, the buffer layer BFL may have a stack structure in which the silicon oxide layer and the silicon nitride layer are alternately stacked with each other.

The semiconductor pattern may be disposed on the buffer layer BFL. The semiconductor pattern may include polysilicon, however, it should not be limited thereto or thereby. The semiconductor pattern may include amorphous silicon, low-temperature polycrystalline silicon, or oxide semiconductor.

FIG. 7 shows only a portion of the semiconductor pattern, and the semiconductor pattern may be further disposed in other areas. The semiconductor pattern may be arranged with a specific rule over pixels. The semiconductor pattern may have different electrical properties depending on whether it is doped or not or whether it is doped with an N-type dopant or a P-type dopant. The semiconductor pattern may include a first region with high conductivity and a second region with low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or may be doped at a concentration lower than the first region.

The first region may have a conductivity greater than that of the second region and may substantially serve as an electrode or a signal line. The second region may substantially correspond to an active area of a transistor. In other words, a portion of the semiconductor pattern may be the active area of the transistor, another portion of the semiconductor pattern may be a source area or a drain area of the transistor, and the other portion of the semiconductor pattern may be a connection electrode or a connection signal line.

Each of the pixels may have an equivalent circuit that includes seven transistors, one capacitor, and a light emitting element, and the equivalent circuit of the pixels may be changed in one or more suitable ways. FIG. 7 shows one transistor 100PC and the light emitting element 100PE included in the pixel.

A source area SC, an active area AL, and a drain area DR may be formed from the semiconductor pattern. The source area SC and the drain area DR may extend in opposite directions to each other from the active area AL in a cross-section. FIG. 7 shows a portion of a connection signal line SCL formed from the semiconductor pattern. In some embodiments, the connection signal line SCL may be electrically connected to the drain area DR of the transistor 100PC in a plane (e.g., in a plan view).

A first insulating layer 10 may be disposed on the buffer layer BFL. The first insulating layer 10 may commonly overlap the pixels and may cover the semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, or hafnium oxide. In the present embodiment, the first insulating layer 10 may have a single-layer structure of a silicon oxide layer. Not only the first insulating layer 10, but also an insulating layer of the circuit layer 120 described later in more detail may be an inorganic layer and/or an organic layer and may have a single-layer or multi-layer structure. The inorganic layer may include at least one of the above-mentioned materials, however, it should not be limited thereto.

A gate GT of the transistor 100PC may be disposed on the first insulating layer 10. The gate GT may be a portion of a metal pattern. The gate GT may overlap the active area AL. The gate GT may be used as a mask in a process of doping the semiconductor pattern.

A second insulating layer 20 may be disposed on the first insulating layer 10 and may cover the gate GT. The second insulating layer 20 may commonly overlap the pixels. The second insulating layer 20 may be an inorganic layer and/or an organic layer and may have a single-layer or multi-layer structure. The second insulating layer 20 may include at least one of silicon oxide, silicon nitride, or silicon oxynitride. In the present embodiment, the second insulating layer 20 may have a multi-layer structure of a silicon oxide layer and a silicon nitride layer.

A third insulating layer 30 may be disposed on the second insulating layer 20. The third insulating layer 30 may have a single-layer structure or a multi-layer structure. As an example, the third insulating layer 30 may have the multi-layer structure of a silicon oxide layer and a silicon nitride layer.

A first connection electrode CNE1 may be disposed on the third insulating layer 30. The first connection electrode CNE1 may be connected to the connection signal line SCL via a contact hole CNT-1 defined through the first, second, and third insulating layers 10, 20, and 30.

A fourth insulating layer 40 may be disposed on the third insulating layer 30. The fourth insulating layer 40 may have a single-layer structure of a silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 via a contact hole CNT-2 defined through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include the light emitting element 100PE. For example, the light emitting element layer 130 may include an organic light emitting material, a quantum dot, a quantum rod, a micro-LED, or a nano-LED. Hereinafter, the organic light emitting element will be described as the light emitting element 100PE, however, the light emitting element 100PE should not be limited thereto or thereby.

The light emitting element 100PE may include a first electrode AE, a light emitting layer EL, and a second electrode CE.

The first electrode AE may be disposed on the sixth insulating layer 60. The first electrode AE may be connected to the second connection electrode CNE2 via a contact hole CNT-3 defined through the sixth insulating layer 60. The first electrode AE may be provided in plural, and the first electrodes AE may overlap the light emitting areas PXA1, PXA2, and PXA3 (refer to FIG. 5), respectively, when viewed in a plane (e.g., in a plan view).

A pixel definition layer 70 may be disposed on the sixth insulating layer 60 and may cover a portion of the first electrode AE. An opening 70-OP may be defined through the pixel definition layer 70. At least a portion of the first electrode AE may be exposed through the opening 70-OP of the pixel definition layer 70.

The first active area F-AA (refer to FIG. 1A) may include a light emitting area and a non-light-emitting area NPXA adjacent to the light emitting area PXA. The non-light-emitting area NPXA may surround the light emitting area PXA. In the present embodiment, the light emitting area PXA may correspond to the portion of the first electrode AE exposed through the opening 70-OP.

The light emitting layer EL may be disposed on the first electrode AE. The light emitting layer EL may be disposed in an area corresponding to the opening 70-OP. For example, the light emitting layer EL may be formed in each of the pixels after being divided into plural portions. In the case where the light emitting layer EL is formed in each of the pixels after being divided into plural portions, each of the light emitting layers EL may emit a light having at least one of blue, red, and green colors, however, it should not be limited thereto or thereby. The light emitting layer EL may be commonly provided in the pixels. In this case, the light emitting layer EL may provide a blue light or a white light.

For example, the light emitting layer EL disposed in the first light emitting area PXA1 (refer to FIG. 5) may emit a green light, the light emitting layer EL disposed in the second light emitting area PXA2 (refer to FIG. 5) may emit a blue light, and the light emitting layer EL disposed in the third light emitting area PXA3 (refer to FIG. 5) may emit a red light.

In some embodiments, a hole control layer may be disposed between the first electrode AE and the light emitting layer EL. The hole control layer may be commonly disposed in the light emitting area PXA and the non-light-emitting area NPXA. The hole control layer may include a hole transport layer and may further include a hole injection layer. An electron control layer may be disposed between the light emitting layer EL and the second electrode CE. The electron control layer may include an electron transport layer and may further include an electron injection layer. The hole control layer and the electron control layer may be commonly formed in the plural pixels using an open mask.

The second electrode CE may be disposed on the light emitting layer EL. The second electrode CE may be referred to as a common electrode CE.

The patterns PT may be disposed on the pixel definition layer 70.

The encapsulation layer 140 may be disposed on the light emitting element layer 130 and may cover the light emitting element layer 130. The encapsulation layer 140 may cover the second electrode CE and the patterns PT. The encapsulation layer 140 may include a first inorganic layer, and organic layer, and a second inorganic layer, which are sequentially stacked in the third direction DR3, however, this is merely an example. The encapsulation layer 140 should not be limited thereto or thereby. As an example, the encapsulation layer 140 may further include a plurality of inorganic layers and a plurality of organic layers.

The sensor layer 200 may include a base layer 201, a first conductive layer 202, a sensing insulating layer 203, a second conductive layer 204, and a cover insulating layer 205.

The base layer 201 may be an inorganic layer that includes at least one of silicon nitride, silicon oxynitride, and silicon oxide. In some embodiments, the base layer 201 may be an organic layer that includes an epoxy-based resin, an acrylic-based resin, or an imide-based resin. The base layer 201 may have a single-layer structure or a multi-layer structure of layers stacked one on another in the third direction DR3.

Each of the first conductive layer 202 and the second conductive layer 204 may have a single-layer structure or a multi-layer structure of layers stacked in the third direction DR3.

The conductive layer having the single-layer structure may include a metal layer or a transparent conductive layer. The metal layer may include molybdenum, silver, titanium, copper, aluminum, or alloy(s) thereof. The transparent conductive layer may include a transparent conductive oxide, such as indium tin oxide (ITO), indium zinc oxide (IZO), zinc oxide (ZnO), indium zinc tin oxide (IZTO), and/or the like. In some embodiments, the transparent conductive layer may include a conductive polymer such as PEDOT, a metal nanowire, a graphene, and/or the like.

The conductive layer having the multi-layer structure may include metal layers. The metal layers may have, for example, a three-layer structure of titanium/aluminum/titanium. The conductive layer having the multi-layer structure may include at least one metal layer and at least one transparent conductive layer.

When viewed in a plane (e.g., in a plan view), the first conductive layer 202 or the second conductive layer 204 may overlap the patterns PT.

At least one of the sensing insulating layer 203 or the cover insulating layer 205 may include an inorganic layer. The inorganic layer may include at least one of aluminum oxide, titanium oxide, silicon oxide, silicon nitride, silicon oxynitride, zirconium oxide, or hafnium oxide.

At least one of the sensing insulating layer 203 or the cover insulating layer 205 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Figure 8A:
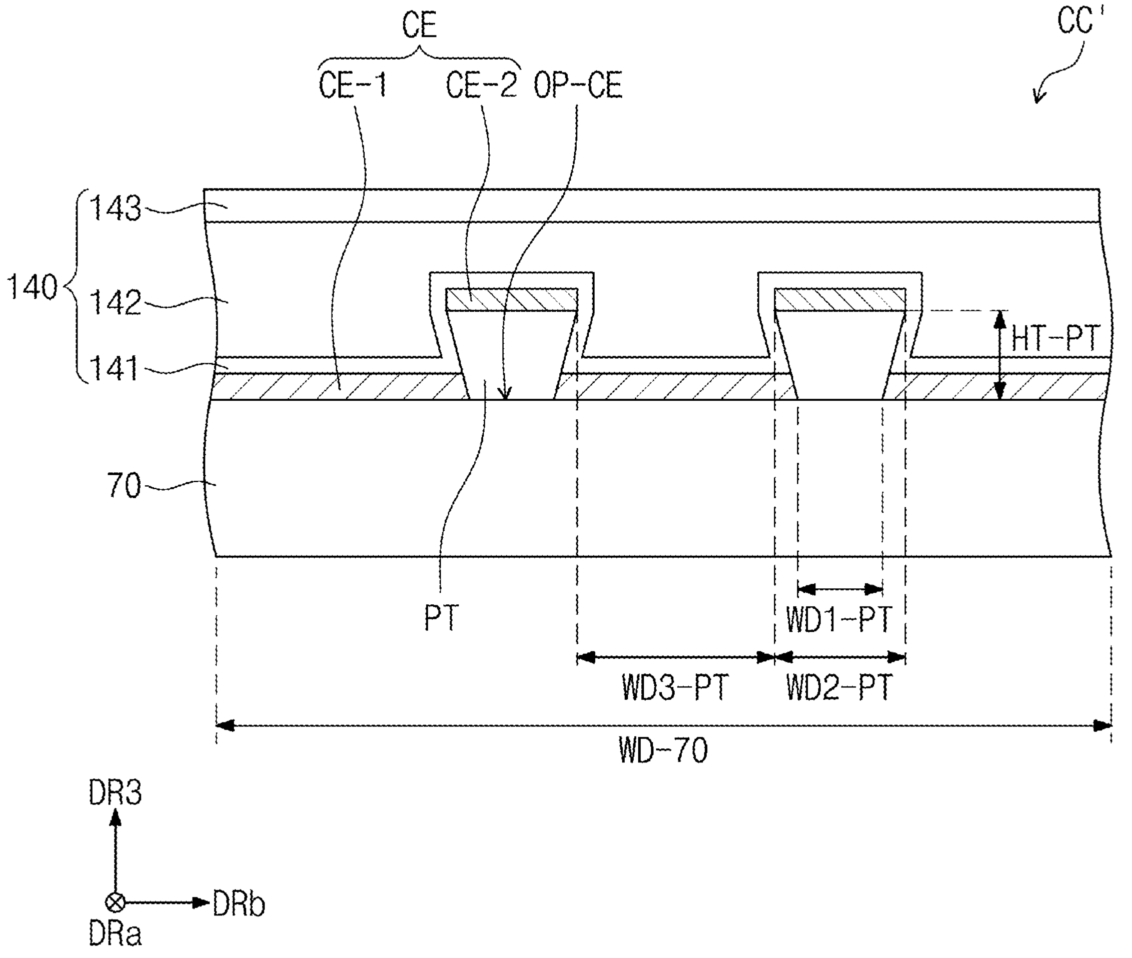
FIG. 8A is an enlarged cross-sectional view of an area CC' of FIG. 7 according to an embodiment of the present disclosure.

FIG. 8A is an enlarged cross-sectional view of an area CC' of FIG. 7 according to an embodiment of the present disclosure.

Referring to FIG. 8A, a width WD-70 of the pixel definition layer 70 between the light emitting layers EL (refer to FIG. 7) may be within a range from about 27 μm to about 32 μm. The width WD-70 of the pixel definition layer 70 may be substantially the same as the distance WD-PXA between the light emitting areas PXA1, PXA2, and PXA3 (refer to FIG. 5).

The patterns PT may be disposed on the pixel definition layer 70. In some embodiments, the number of the patterns PT may be two. Each of the patterns PT may have a reverse taper shape.

The second electrode CE may be disposed on the pixel definition layer 70 and the patterns PT. The second electrode CE may include a first electrode portion CE-1 and second electrode portions CE-2.

The first electrode portion CE-1 may be disposed on the light emitting layer EL (refer to FIG. 7) and the pixel definition layer 70. A plurality of openings OP-CE that does not overlap the patterns PT when viewed in a plane may be defined through the first electrode portion CE-1.

When viewed in a plane (e.g., in a plan view), the second electrode portions CE-2 may respectively overlap the openings OP-CE. The second electrode portions CE-2 may be disposed on the patterns PT, respectively.

An inclined portion of each of the patterns PT having the reverse taper shape may not be covered by the second electrode CE due to a step coverage of the conductive material included in the second electrode CE. A side surface of the reverse taper shape may be opened. The second electrode CE may not be disposed on the side surface of each of the patterns PT.

The side surface of each of the patterns PT may be in direct contact with the first inorganic layer 141. An adhesion between the side surface of each of the patterns PT and the first inorganic layer 141 may be smaller than an adhesion between the second electrode CE and the first inorganic layer 141. Accordingly, the encapsulation layer 140 may be prevented or reduced from being separated by an external force.

In contrast to the present disclosure, a case where each of the light emitting layer EL (refer to FIG. 7) and the second electrode CE is formed without being disconnected between the light emitting areas PXA1, PXA2, and PXA3 (refer to FIG. 5) adjacent to each other, a current may leak, and the light emitting layers EL (refer to FIG. 7) adjacent to each other may influence each other. In this case, the light emitting layer EL (refer to FIG. 7) may not emit a light having a desired color due to the leakage current, so color reproducibility of the electronic device 1000 (refer to FIG. 1A) may be lowered. However, according to the present disclosure, a portion of the second electrode CE may be disconnected by the openings OP-CE. A resistance of the second electrode CE may increase. The leakage current may be prevented or reduced from occurring through the second electrode CE. Accordingly, a reliability of the electronic device 1000 (refer to FIG. 1A) may be improved.

The encapsulation layer 140 may include the first inorganic layer 141, the organic layer 142, and the second inorganic layer 143.

The first inorganic layer 141 may prevent or reduce external moisture or oxygen from entering the light emitting element layer 130 (refer to FIG. 7). For example, the first inorganic layer 141 may include silicon nitride, silicon oxide, or a compound thereof. The first inorganic layer 141 may cover the second electrode CE and the patterns PT.

The organic layer 142 may be disposed on the first inorganic layer 141 and may provide a flat surface. Curved portions on an upper surface of the first inorganic layer 141 or particles remaining on the first inorganic layer 141 may be covered by the organic layer 142. For example, the organic layer 142 may include an acrylic-based organic layer, however, it should not be limited thereto or thereby.

The second inorganic layer 143 may be disposed on the organic layer 142 and may cover the organic layer 142. The second inorganic layer 143 may encapsulate moisture drained from the organic layer 142 and may prevent or reduce the moisture from entering other elements. The second inorganic layer 143 may include silicon nitride, silicon oxide, or a compound thereof.

When viewed in a plane (e.g., in a plan view), each of the patterns PT may have a width from about 3 μm to about 4 μm. A first width WD1-PT of a lower surface of the reverse taper shape may be within a range from about 3 μm to about 3.3 μm. For example, the first width WD1-PT may be about 3.15 μm. A second width WD2-PT of an upper surface of the reverse taper shape may be within a range from about 3.5 μm to about 4 μm. For example, the second width WD2-PT may be about 3.9 μm.

In contrast to the present disclosure, a case where the width of each of the patterns PT is smaller than about 3 μm, the encapsulation layer 140 may be easily separated in the folded state of the electronic device 1000 (refer to FIG. 1A). In a case where the width of each of the patterns PT is greater than about 4 μm, it is difficult to place the patterns PT between the light emitting areas. When the width of each of the patterns PT is smaller than about 3.0 micrometers or greater than about 4.0 micrometers in the flexible electronic device 1000 (refer to FIG. 1A), the adhesion between the components may be reduced, and thus, the separation may occur. However, according to the present disclosure, each of the patterns PT may have the reverse taper shape. The patterns PT may have a shape appropriate or suitable to prevent or reduce the occurrence of the separation phenomenon. The encapsulation layer 140 may be prevented or reduced from being separated by the external force. Accordingly, the reliability of the electronic device 1000 (refer to FIG. 1A) may be improved.

Each of the patterns PT may have a thickness HT-PT from about 1 μm to about 2 μm. For example, the thickness HT-PT may be about 1.5 μm.

In a case where the thickness HT-PT is smaller than about 1 μm, the side surface of each of the patterns PT may be insufficiently secured in the folded state of the electronic device 1000 (refer to FIG. 1A), and thus, the encapsulation layer 140 may be easily separated. In a case where the thickness HT-PT is greater than about 2 μm, the thickness of the encapsulation layer 140 may increase. However, according to the present disclosure, the patterns PT may have a shape appropriate or suitable to prevent or reduce the occurrence of the separation phenomenon. The encapsulation layer 140 may be prevented or reduced from being separated by the external force. Accordingly, the reliability of the electronic device 1000 (refer to FIG. 1A) may be improved.

A distance WD3-PT between the patterns PT may be within a range from about 1.5 μm to about 4.5 μm. For example, the distance WD3-PT may be about 3.5 μm. According to the present disclosure, the separation of the encapsulation layer 140 may be prevented or reduced by the widths WD1-PT and WD2-PT of each of the patterns PT, the thickness HT-PT of each of the patterns PT, and the distance WD3-PT between the patterns PT. Accordingly, the reliability of the electronic device 1000 (refer to FIG. 1A) may be improved.

Figure 8B:
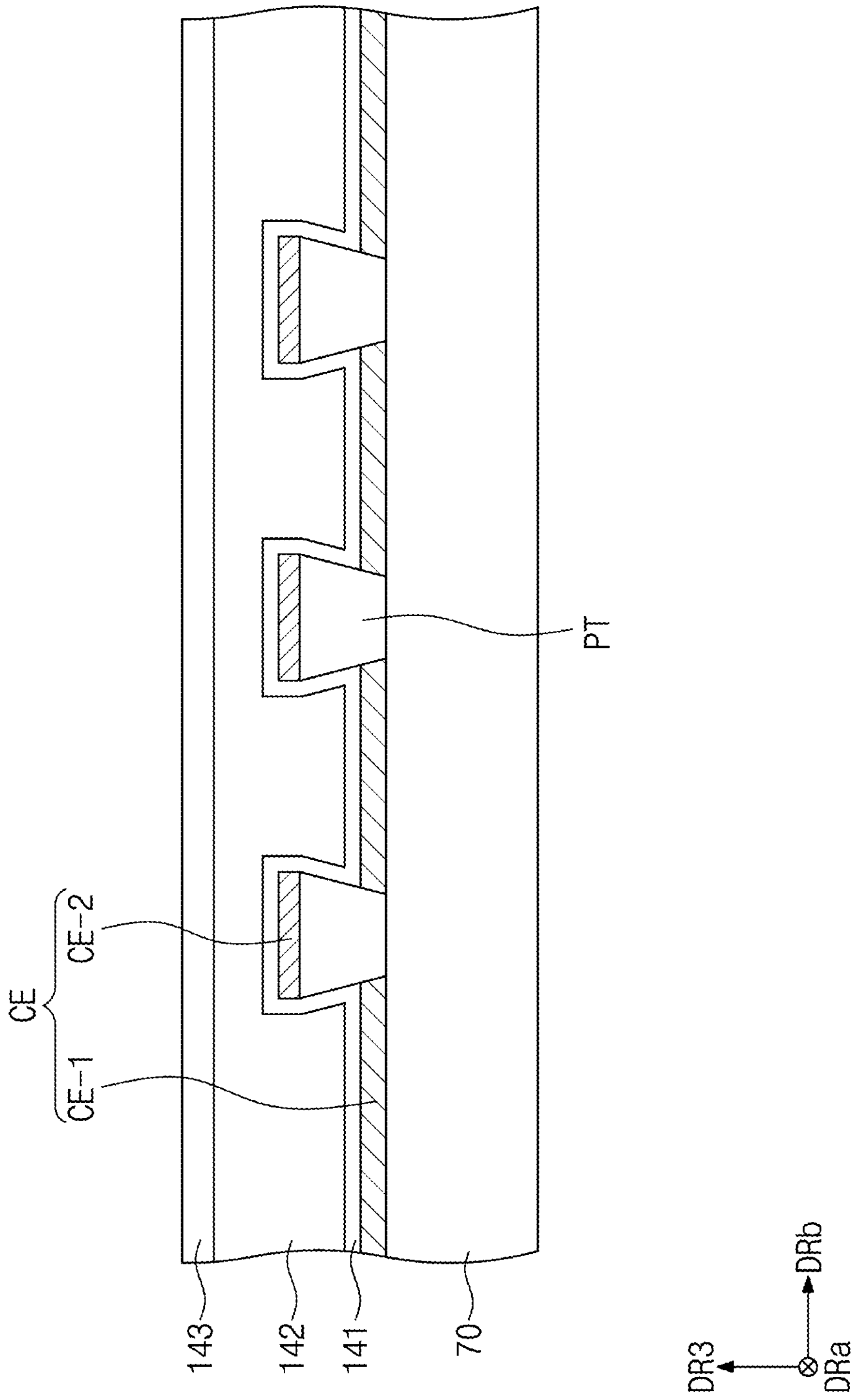
FIG. 8B is an enlarged cross-sectional view of an area corresponding to the area CC' of FIG. 7 according to an embodiment of the present disclosure.

FIG. 8B is an enlarged cross-sectional view of an area corresponding to the area CC' of FIG. 7 according to an embodiment of the present disclosure. In FIG. 8B, the same reference numerals denote the same elements in FIG. 8A, and thus, detailed descriptions of the same elements will not be provided.

Referring to FIG. 8B, the patterns PT may be disposed on the pixel definition layer 70. In FIG. 8B, three patterns PT are provided. However, this is merely an example, and the number of the patterns PT should not be limited to three. The number of the patterns PT may be determined based on the width WD-70 (refer to FIG. 8A) of the pixel definition layer 70 disposed between the light emitting layers EL (refer to FIG. 7). Each of the patterns PT may have the reverse taper shape.

According to the present disclosure, as the number of the patterns PT increases, the separation of the encapsulation layer 140 by the external force may be more efficiently prevented or reduced. Accordingly, the reliability of the electronic device 1000 (refer to FIG. 1A) may be improved.

Figure 9:
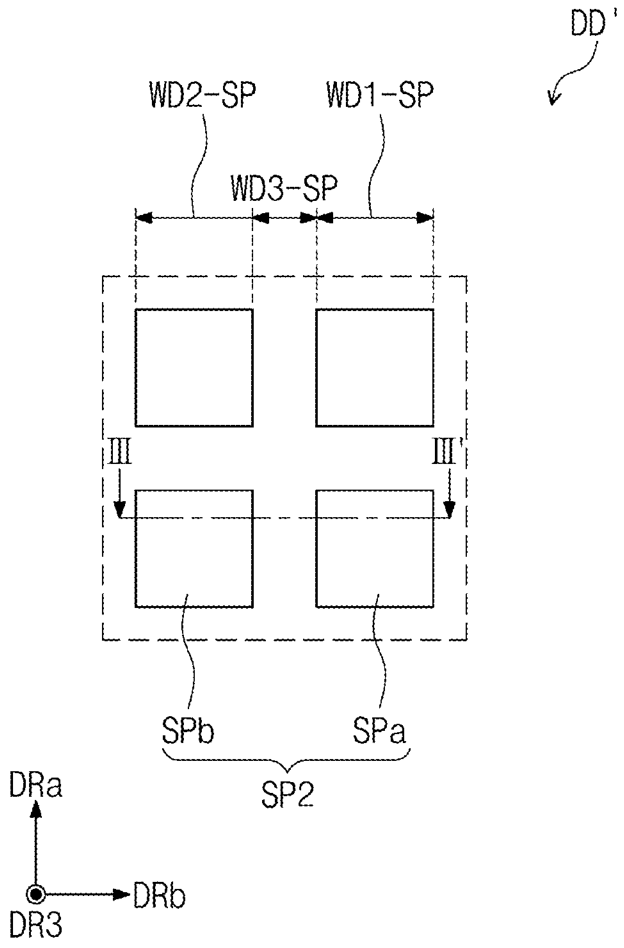
FIG. 9 is a plan view of an area DD' of FIG. 5 according to an embodiment of the present disclosure.
Figure 10:
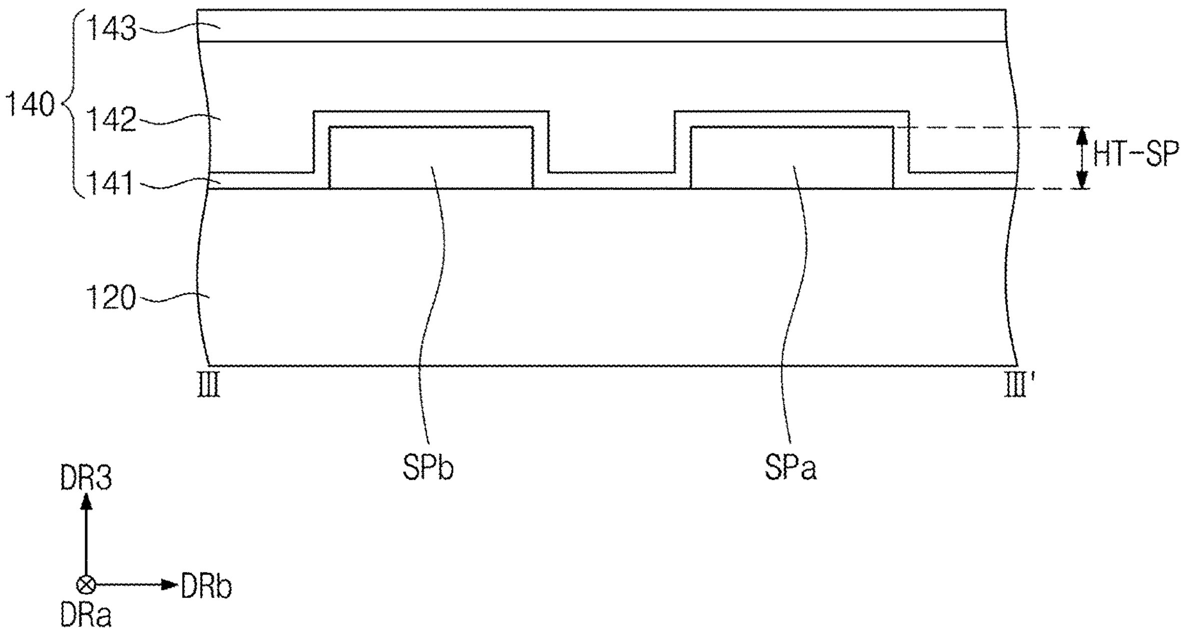
FIG. 10 is a cross-sectional view taken along a line III-III' of FIG. 9 according to an embodiment of the present disclosure.

FIG. 9 is a plan view of an area DD' of FIG. 5 according to an embodiment of the present disclosure, and FIG. 10 is a cross-sectional view taken along a line III-III' of FIG. 9 according to an embodiment of the present disclosure. In FIG. 10, the same reference numerals denote the same elements in FIGS. 8A, and thus, detailed descriptions of the same elements will not be provided.

Referring to FIGS. 9 and 10, the second spacer SP2 may include the first portion SPa and the second portion SPb.

The first portion SPa and the second portion SPb may be arranged in n by m (n×m) matrix (each of n and m is a positive integer number). FIG. 9 shows the second spacer SP2 with two by two (2×2) matrix according to an embodiment of the present disclosure.

A width WD1-SP of the first portion SPa and a width WD2-SP of the second portion SPb may be within a range from about 9 μm to about 13 μm.

A distance WD3-SP between the first portion SPa and the second portion SPb may be within a range from about 1.5 μm to about 4.5 μm.

A thickness HT-SP of each of the first portion SPa and the second portion SPb may be within a range from about 2.3 μm to about 3.3 μm.

According to the present disclosure, the second spacer SP2 may have a shape appropriate or suitable to prevent or reduce the occurrence of the separation phenomenon. The first inorganic layer 141 may be prevented or reduced from being separated by the external force. Accordingly, the reliability of the electronic device 1000 (refer to FIG. 1A) may be improved.

Figure 11A:
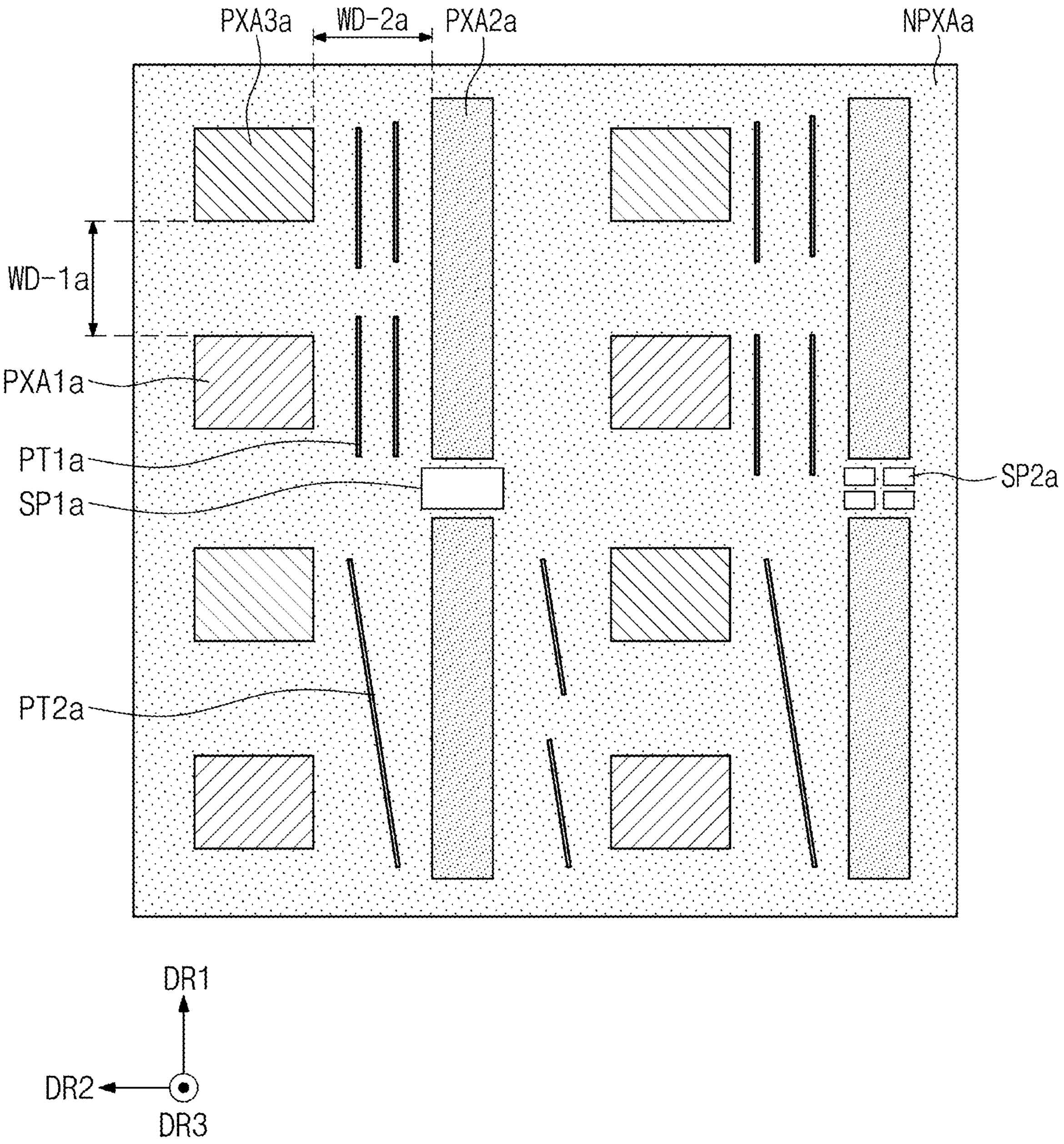
FIGS. 11A-11H are plan views of an area corresponding to the area AA' of FIG. 1A according to an embodiment of the present disclosure.

FIG. 11A is a plan view of an area corresponding to the area AA' of FIG. 1A according to an embodiment of the present disclosure. In FIG. 11A, the same reference numerals denote the same elements in FIG. 5, and thus, detailed descriptions of the same elements will not be provided.

Referring to FIG. 11A, a display panel DP (refer to FIG. 4) may include a first light emitting area PXA1*a*, a second light emitting area PXA2*a*, a third light emitting area PXA3*a*, and a non-light-emitting area NPXAa. The display panel DP (refer to FIG. 4) may provide a first color light through the first light emitting area PXA1*a*, may provide a second color light through the second light emitting area PXA2*a*, and may provide a third color light through the third light emitting area PXA3*a*. The first color light, the second color light, and the third color light may have different colors from each other. For example, the first color light may be a green light, the second color light may be a blue light, and the third color light may be a red light.

Each of the first light emitting area PXA1*a* and the third light emitting area PXA3*a* may have a quadrangular shape, and the second light emitting area PXA2*a* may have a rectangular shape.

The first light emitting area PXA1*a* may be spaced apart from the second light emitting area PXA2*a* in the second direction DR2. The first light emitting area PXA1*a* may be spaced apart from the third light emitting area PXA3*a* in the first direction DR1. The second light emitting area PXA2*a* may extend (e.g., may have a length) in the first direction DR1.

A first width WD-1*a* between the first light emitting area PXA1*a* and the third light emitting area PXA3*a* may be within a range from about 15 μm to about 20 μm. A second width WD-2*a* between the first light emitting area PXA1*a* and the second light emitting area PXA2*a* and between the third light emitting area PXA3*a* and the second light emitting area PXA2*a* may be within a range from about 12 μm to about 15 μm.

A plurality of patterns may be disposed between the first light emitting area PXA1*a* and the second light emitting area PXA2*a* and between the third light emitting area PXA3*a* and the second light emitting area PXA2*a*. Each of the patterns may extend (e.g., may have a length) in a direction crossing a folding axis AX1 (refer to FIG. 1A).

The patterns may include a plurality of first patterns PT1*a* and a plurality of second patterns PT2*a*. Each of the first patterns PT1*a* may extend in the first direction DR1. The first patterns PT1*a* may be spaced apart from each other in the second direction DR2. FIG. 11A shows two first patterns PT1*a* spaced apart from each other in the second direction DR2 as a representative example, however, the number of the first patterns PT1*a* should not be limited thereto or thereby. And the number of first patterns PT1*a*(s) arranged in the second direction is not limited thereto. Each of the second patterns PT2*a* may extend (e.g., may have a length) in a direction crossing each of the first direction DR1 and the second direction DR2.

A plurality of spacers may be disposed adjacent to the second light emitting area PXA2*a*. The spacers may include a first spacer SP1*a* and a second spacer SP2*a*. The second spacer SP2*a* may be arranged in an n by m (n×m) matrix (each of n and m is a positive integer number).

According to an embodiment, the first pattern PT1*a*, the second pattern PT2*a*, and the second spacer SP2*a* may prevent or reduce an encapsulation layer 140 (refer to FIG. 4) from being separated by an external force. Accordingly, a reliability of an electronic device 1000 (refer to FIG. 1A) may be improved.

Figure 11B:
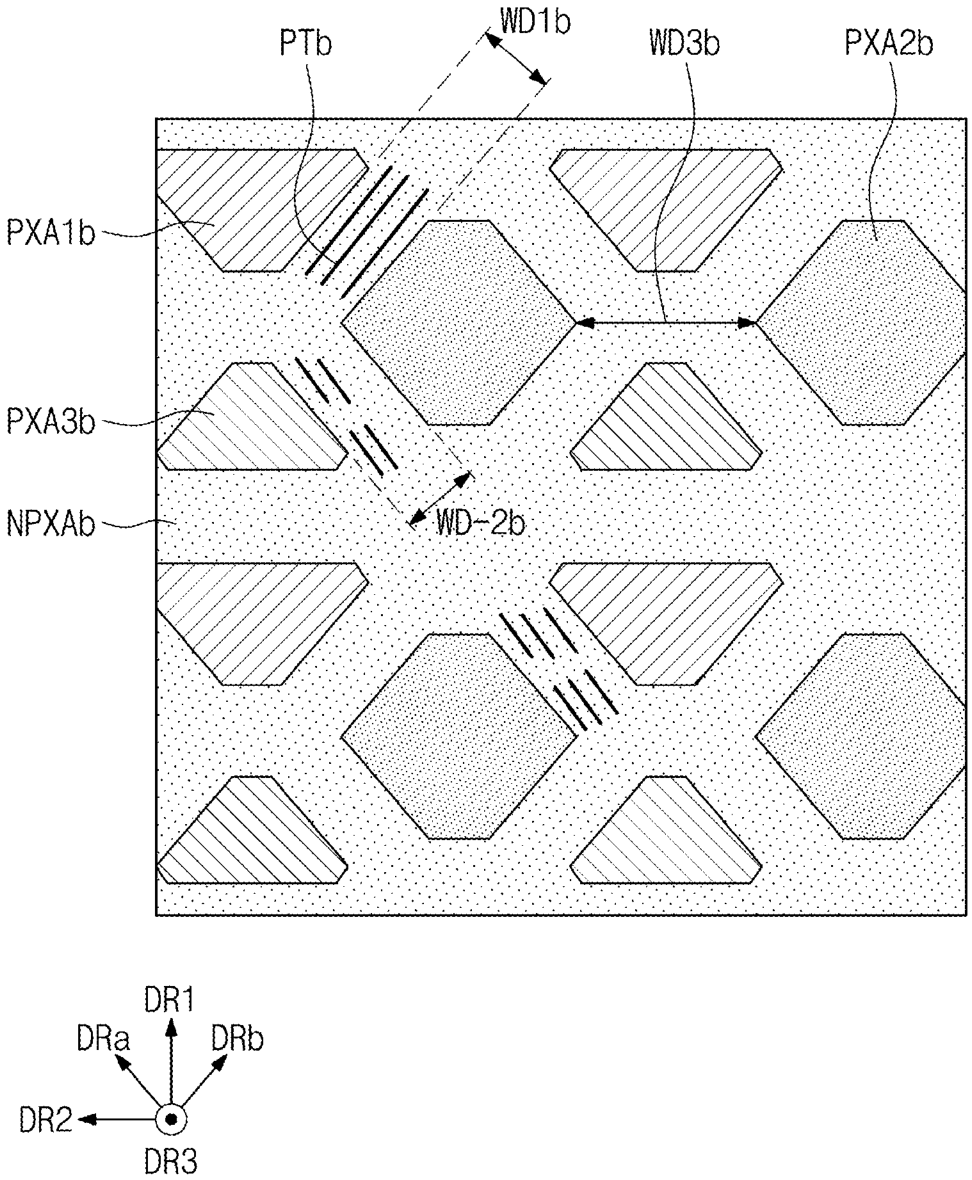

FIG. 11B is a plan view of an area corresponding to the area AA' of FIG. 1A according to an embodiment of the present disclosure. In FIG. 11B, the same reference numerals denote the same elements in FIG. 5, and thus, detailed descriptions of the same elements will not be provided.

Referring to FIG. 11B, a display panel DP (refer to FIG. 4) may include a first light emitting area PXA1*b*, a second light emitting area PXA2*b*, a third light emitting area PXA3*b*, and a non-light-emitting area NPXAb. The display panel DP (refer to FIG. 4) may provide a first color light through the first light emitting area PXA1*b*, may provide a second color light through the second light emitting area PXA2*b*, and may provide a third color light through the third light emitting area PXA3*b*. The first color light, the second color light, and the third color light may have different colors from each other. As an example, the first color light may be a green light, the second color light may be a blue light, and the third color light may be a red light.

Each of the first light emitting area PXA1*b* and the third light emitting area PXA3*b* may have a polygonal shape, and the second light emitting area PXA2*b* may have a hexagonal shape. Each of the first light emitting area PXA1*b* and the third light emitting area PXA3*b* may have a size smaller than that of the second light emitting area PXA2*b*.

The first light emitting area PXA1*b* may be spaced apart from the second light emitting area PXA2*b* in a first cross direction DRa. The first light emitting area PXA1*b* may be spaced apart from the third light emitting area PXA3*b* in the first direction DR1. The third light emitting area PXA3*b* may be spaced apart from the second light emitting area PXA2*b* in a second cross direction DRb.

A first width WD1*b* between the first light emitting area PXA1*b* and the second light emitting area PXA2*b* may be within a range from about 27 μm to about 28 μm. A second width WD-2*b* between the third light emitting area PXA3*b* and the second light emitting area PXA2*b* may be substantially the same as the first width WD1*b*. The second light emitting area PXA2*b* may be provided in plural, and a third width WD3*b* between the second light emitting areas PXA2*b* may be within a range from about 60 μm to about 66 μm.

A plurality of patterns PTb may be disposed between the first light emitting area PXA1*b* and the second light emitting area PXA2*b* and between the third light emitting area PXA3*b* and the second light emitting area PXA2*b*. Each of the patterns PTb may extend (e.g., may have a length) in a direction crossing a folding axis AX1 (refer to FIG. 1A).

According to the present disclosure, the patterns PTb may prevent or reduce an encapsulation layer 140 (refer to FIG. 4) from being separated by an external force. Accordingly, a reliability of an electronic device 1000 (refer to FIG. 1A) may be improved.

Figure 11C:
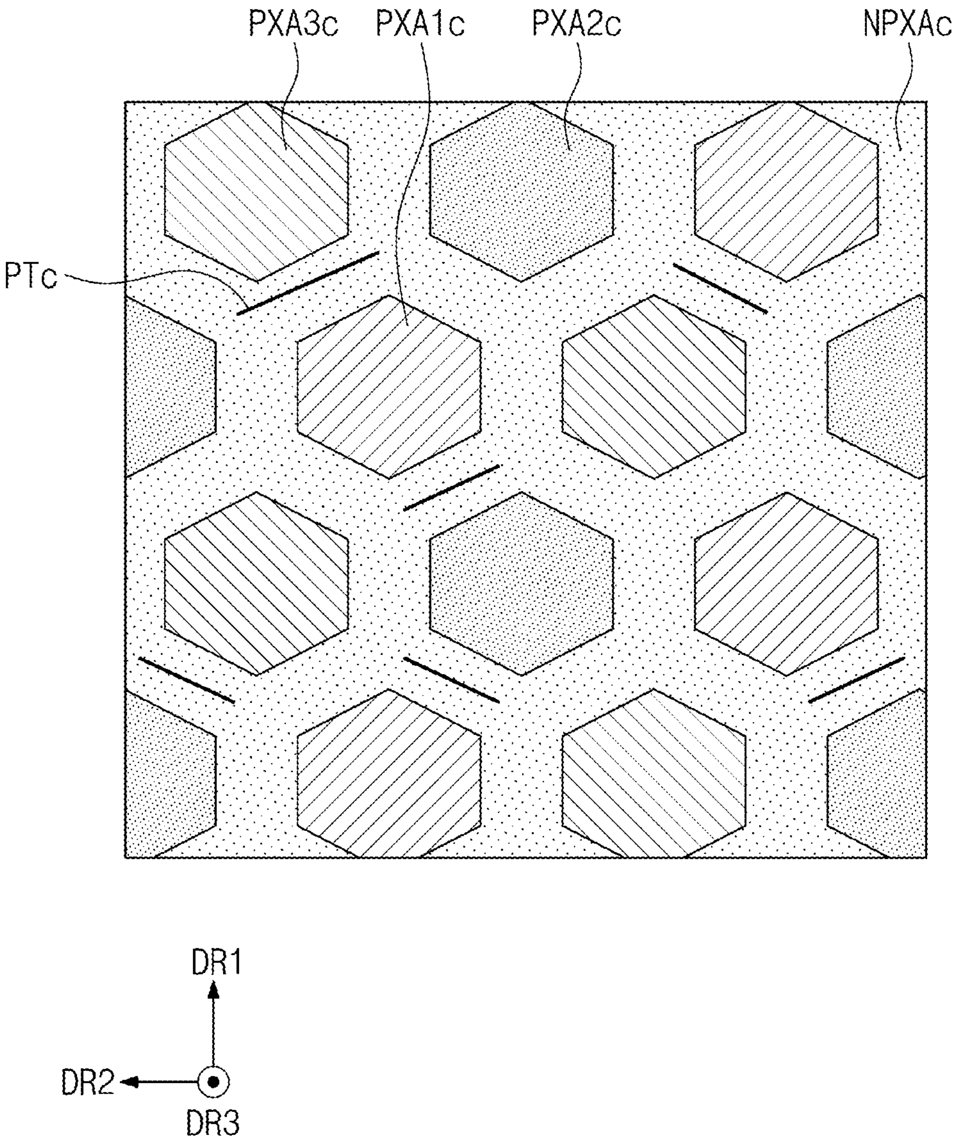

FIG. 11C is a plan view of an area corresponding to the area AA' of FIG. 1A according to an embodiment of the present disclosure. In FIG. 11C, the same reference numerals denote the same elements in FIG. 5, and thus, detailed descriptions of the same elements will not be provided.

Referring to FIG. 11C, a display panel DP (refer to FIG. 4) may include a first light emitting area PXA1*c*, a second light emitting area PXA2*c*, a third light emitting area PXA3*c*, and a non-light-emitting area NPXAc. The display panel DP (refer to FIG. 4) may provide a first color light through the first light emitting area PXA1*c*, may provide a second color light through the second light emitting area PXA2*c*, and may provide a third color light through the third light emitting area PXA3*c*. The first color light, the second color light, and the third color light may have different colors from each other. For example, the first color light may be a green light, the second color light may be a blue light, and the third color light may be a red light.

Each of the first light emitting area PXA1*c*, the second light emitting area PXA2*c*, and the third light emitting area PXA3*c* may have a hexagonal shape. The first light emitting area PXA1*c*, the second light emitting area PXA2*c*, and the third light emitting area PXA3*c* may have the same size.

Each of the first light emitting area PXA1*c*, the second light emitting area PXA2*c*, and the third light emitting area PXA3*c* may be provided in plural. The first light emitting area PXA1*c* may be surrounded by the second light emitting areas PXA2*c* spaced apart from each other and the third light emitting areas PXA3*c* spaced apart from each other. The second light emitting area PXA2*c* may be surrounded by the first light emitting areas PXA1*c* spaced apart from each other and the third light emitting areas PXA3*c* spaced apart from each other. The third light emitting area PXA3*c* may be surrounded by the first light emitting areas PXA1*c* spaced apart from each other and the second light emitting areas PXA2*c* spaced apart from each other.

At least one pattern PTc may be disposed between two light emitting areas of the first light emitting area PXA1*c*, the second light emitting area PXA2*c*, and the third light emitting area PXA3*c*. The pattern PTc may be provided in plural, and each of the patterns PTc may extend (e.g., may have a length) in a direction crossing a folding axis AX1 (refer to FIG. 1A).

According to the present disclosure, the patterns PTc may prevent or reduce an encapsulation layer 140 (refer to FIG. 4) from being separated by an external force. Accordingly, a reliability of an electronic device 1000 (refer to FIG. 1A) may be improved.

Figure 11D:
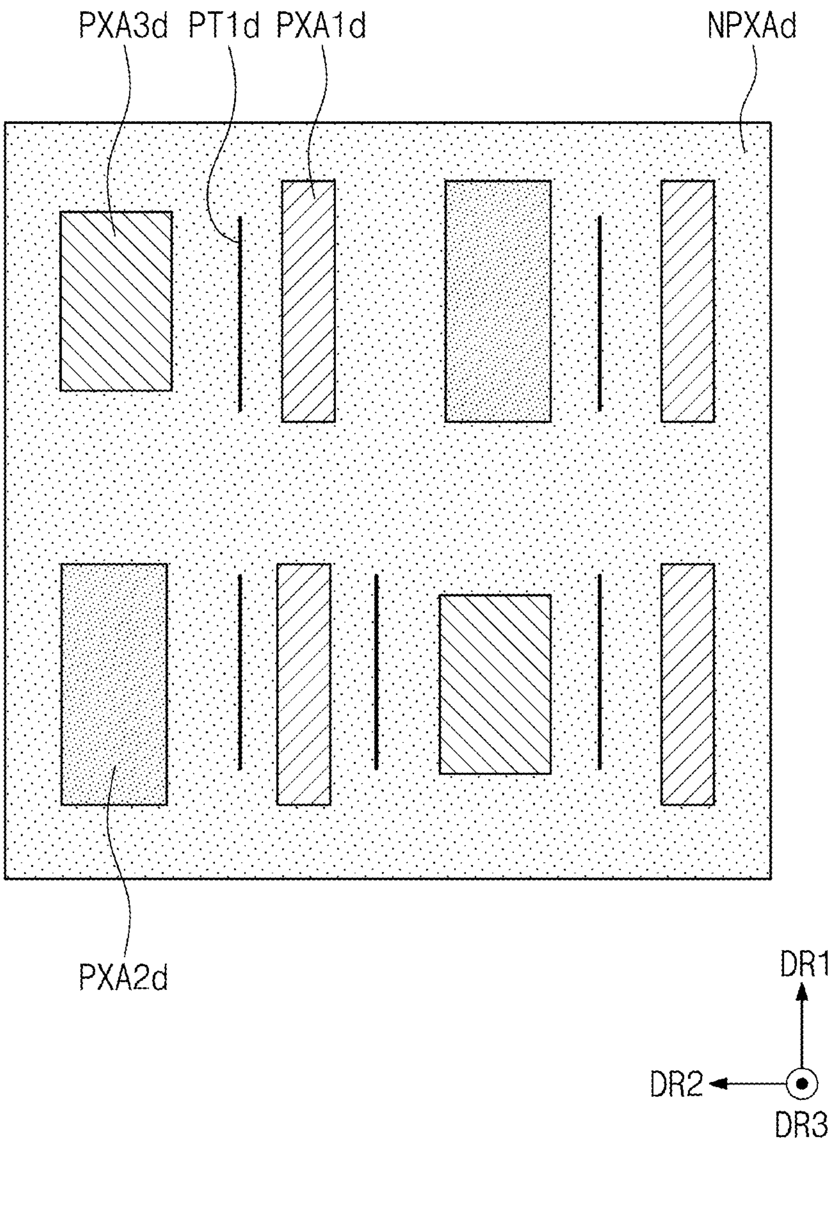

FIG. 11D is a plan view of an area corresponding to the area AA' of FIG. 1A according to an embodiment of the present disclosure. In FIG. 11D, the same reference numerals denote the same elements in FIG. 5, and thus, detailed descriptions of the same elements will not be provided.

Referring to FIG. 11D, a display panel DP (refer to FIG. 4) may include a first light emitting area PXA1*d*, a second light emitting area PXA2*d*, a third light emitting area PXA3*d*, and a non-light-emitting area NPXAd. The display panel DP (refer to FIG. 4) may provide a first color light through the first light emitting area PXA1*d*, may provide a second color light through the second light emitting area PXA2*d*, and may provide a third color light through the third light emitting area PXA3*d*. The first color light, the second color light, and the third color light may have different colors from each other. For example, the first color light may be a green light, the second color light may be a blue light, and the third color light may be a red light.

Each of the first light emitting area PXA1*d*, the second light emitting area PXA2*d*, and the third light emitting area PXA3*d* may have a rectangular shape.

The first light emitting area PXA1*d* may be disposed between the second light emitting area PXA2*d* and the third light emitting area PXA3*d* (i.e., spaced apart from the second light emitting area PXA2*d* in the second direction DR2). The second light emitting area PXA2*d* and the third light emitting area PXA3*d* may be spaced apart from each other in the first direction DR1.

A plurality of patterns PT1*d* may be disposed between the first light emitting area PXA1*d*, the second light emitting area PXA2*d*, and the third light emitting area PXA3*d*. Each of the patterns PT1*d* may extend (e.g., may have a length) in a direction crossing a folding axis AX1 (refer to FIG. 1A). For example, the patterns PT1*d* may extend in the first direction DR1.

According to the present embodiment, the patterns PT1*d* may prevent or reduce an encapsulation layer 140 (refer to FIG. 4) from being separated by an external force. Accordingly, a reliability of an electronic device 1000 (refer to FIG. 1A) may be improved.

Figure 11E:
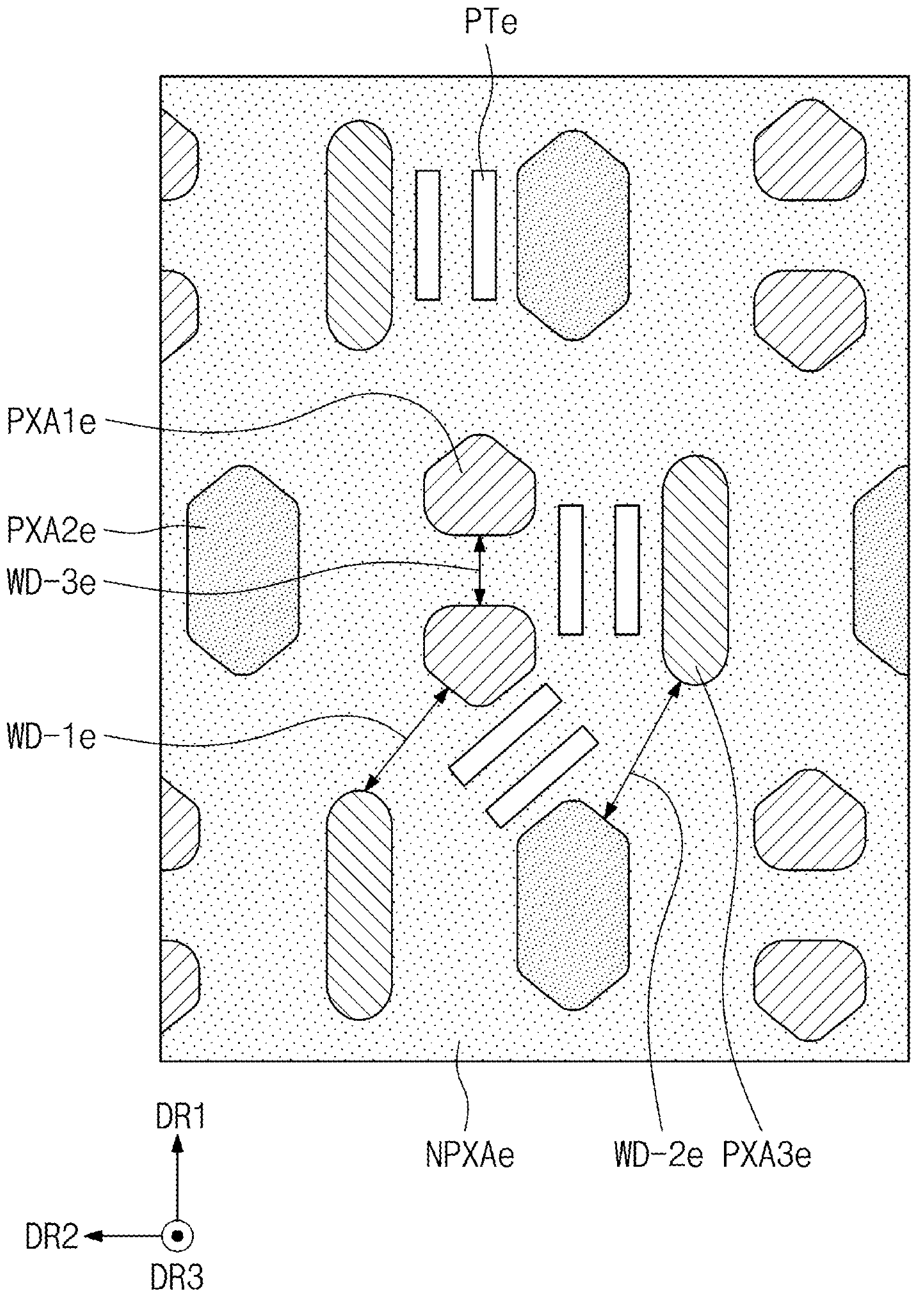

FIG. 11E is a plan view of an area corresponding to the area AA' of FIG. 1A according to an embodiment of the present disclosure. In FIG. 11E, the same reference numerals denote the same elements in FIG. 5, and thus, detailed descriptions of the same elements will not be provided.

Referring to FIG. 11E, a display panel DP (refer to FIG. 4) may include a first light emitting area PXA1*e*, a second light emitting area PXA2*e*, a third light emitting area PXA3*e*, and a non-light-emitting area NPXAe. The display panel DP (refer to FIG. 4) may provide a first color light through the first light emitting area PXA1*e*, may provide a second color light through the second light emitting area PXA2*e*, and may provide a third color light through the third light emitting area PXA3*e*. The first color light, the second color light, and the third color light may have different colors from each other. For example, the first color light may be a green light, the second color light may be a blue light, and the third color light may be a red light.

The first light emitting area PXA1*e* may be provided in plural. Two first light emitting areas PXA1*e* may be disposed spaced apart from each other in the first direction DR1. The second light emitting area PXA2*e* may be spaced apart from the two first light emitting areas PXA1*e* in the second direction DR2. The third light emitting area PXA3*e* may be spaced apart from the two first light emitting areas PXA1*e* in the second direction DR2.

A first width WD-1*e* between the first light emitting area PXA1*e* and the third light emitting area PXA3*e* may be within a range from about 23 μm to about 24 μm. A second width WD-2*e* between the second light emitting area PXA2*e* and the third light emitting area PXA3*e* may be within a range from about 28 μm to about 29 μm. A third width WD-3*e* between the two first light emitting areas PXA1*e* may be within a range from about 14 μm to about 15 μm.

A plurality of patterns PTe may be disposed between the first light emitting area PXA1*e*, the second light emitting area PXA2*e*, and the third light emitting area PXA3*e*. Each of the patterns PTe may extend (e.g., may have a length) in a direction crossing a folding axis AX1 (refer to FIG. 1A).

According to the present embodiment, the patterns PTe may prevent or reduce an encapsulation layer 140 (refer to FIG. 4) from being separated by an external force. Accordingly, a reliability of an electronic device 1000 (refer to FIG. 1A) may be improved.

Figure 11F:
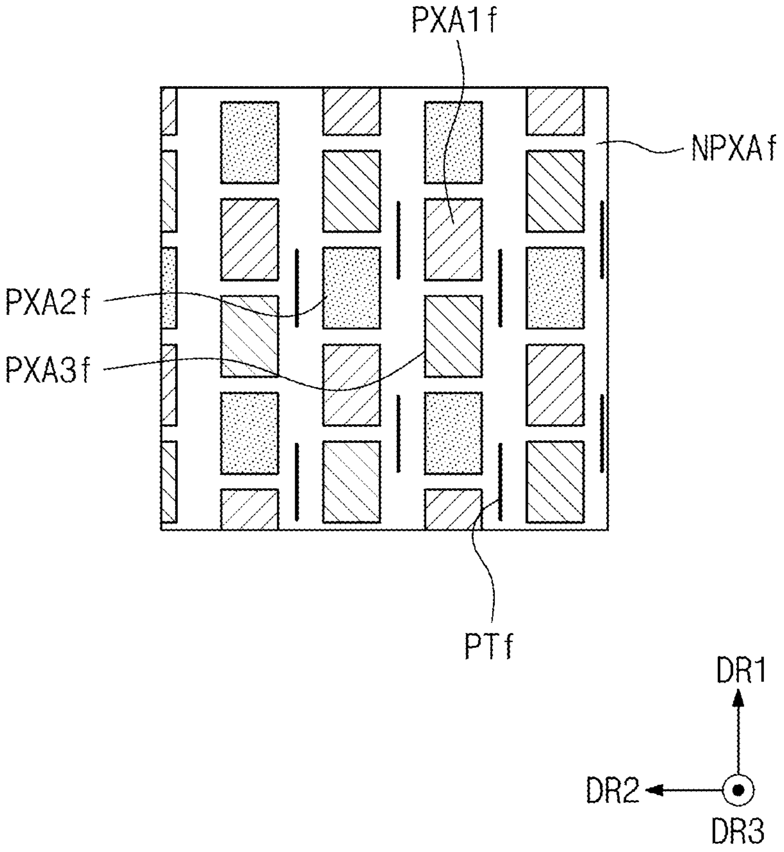

FIG. 11F is a plan view of an area corresponding to the area AA' of FIG. 1A according to an embodiment of the present disclosure. In FIG. 11F, the same reference numerals denote the same elements in FIG. 5, and thus, detailed descriptions of the same elements will not be provided.

Referring to FIG. 11F, a display panel DP (refer to FIG. 4) may include a first light emitting area PXA1*f*, a second light emitting area PXA2*f*, a third light emitting area PXA3*f*, and a non-light-emitting area NPXAf. The display panel DP (refer to FIG. 4) may provide a first color light through the first light emitting area PXA1*f*, may provide a second color light through the second light emitting area PXA2*f*, and may provide a third color light through the third light emitting area PXA3*f*. The first color light, the second color light, and the third color light may have different colors from each other. For example, the first color light may be a green light, the second color light may be a blue light, and the third color light may be a red light.

Each of the first light emitting area PXA1*f*, the second light emitting area PXA2*f*, and the third light emitting area PXA3*f* may have a quadrangular shape.

The first light emitting area PXA1*f* may be spaced apart from the second light emitting area PXA2*f* and the third light emitting area PXA3*f* in the second direction DR2.

Each of patterns PTf may be disposed between the first light emitting area PXA1*f*, the second light emitting area PXA2*f*, and the third light emitting area PXA3*f*. Each of the patterns PTf may extend (e.g., may have a length) in a direction crossing a folding axis AX1 (refer to FIG. 1A). The patterns PTf may extend in the first direction DR1.

According to the present embodiment, the patterns PTf may prevent or reduce an encapsulation layer 140 (refer to FIG. 4) from being separated by an external force. Accordingly, a reliability of an electronic device 1000 (refer to FIG. 1A) may be improved.

Figure 11G:
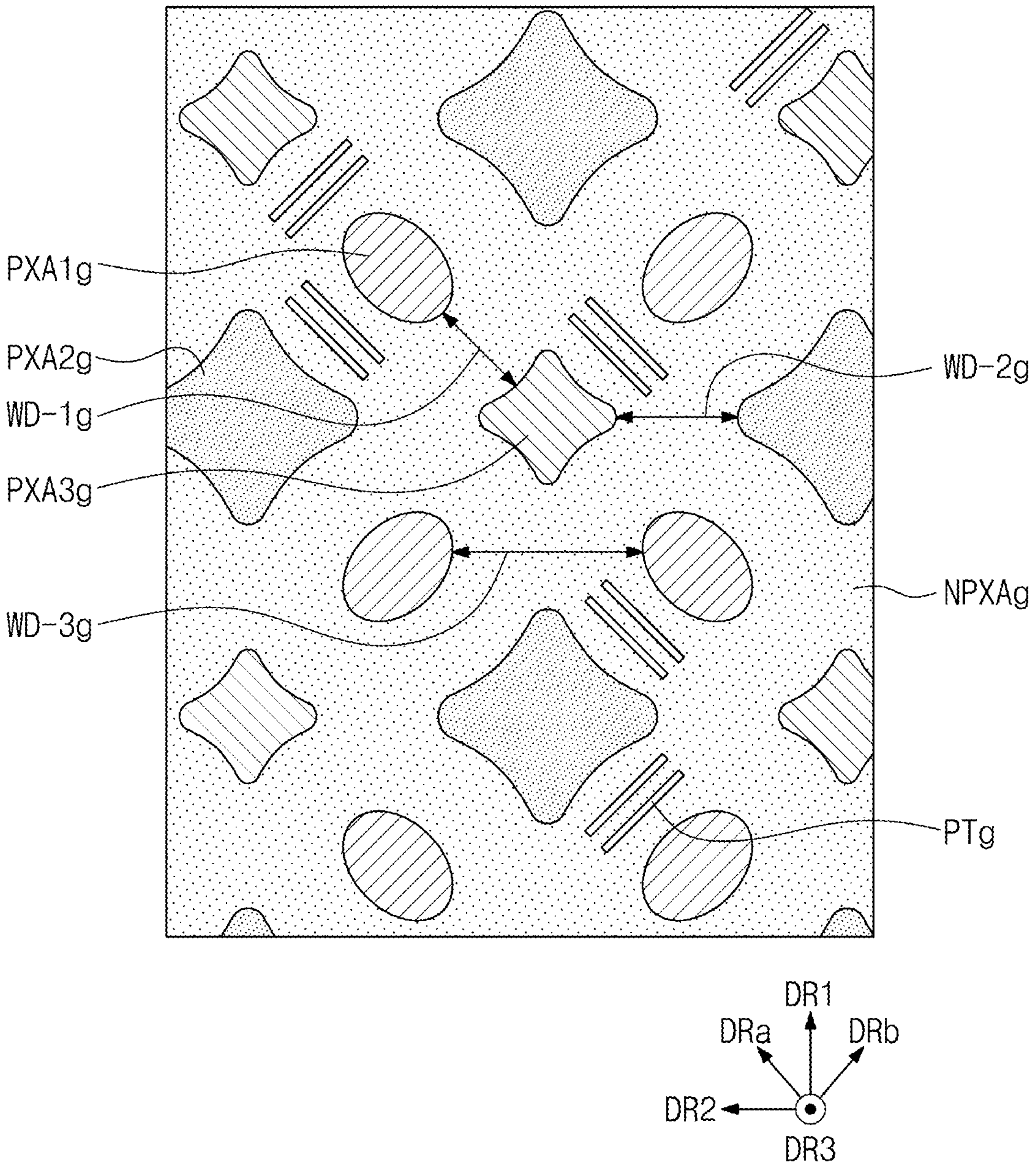

FIG. 11G is a plan view of an area corresponding to the area AA' of FIG. 1A according to an embodiment of the present disclosure. In FIG. 11G, the same reference numerals denote the same elements in FIG. 5, and thus, detailed descriptions of the same elements will not be provided.

Referring to FIG. 11G, a display panel DP (refer to FIG. 4) may include a first light emitting area PXA1*g*, a second light emitting area PXA2*g*, a third light emitting area PXA3*g*, and a non-light-emitting area NPXAg. The display panel DP (refer to FIG. 4) may provide a first color light through the first light emitting area PXA1*g*, may provide a second color light through the second light emitting area PXA2*g*, and may provide a third color light through the third light emitting area PXA3*g*. The first color light, the second color light, and the third color light may have different colors from each other. For example, the first color light may be a green light, the second color light may be a blue light, and the third color light may be a red light.

The first light emitting area PXA1*g*, the second light emitting area PXA2*g*, and the third light emitting area PXA3*g* may be spaced apart from each other in a first cross direction DRa and a second cross direction DRb.

A first width WD-1*g* in the first cross direction DRa between the first light emitting area PXA1*g* and the third light emitting area PXA3*g* may be within a range from about 23 μm to about 24 μm. The first width WD-1*g* may be substantially the same as a width in the second cross direction DRb between the first light emitting area PXA1*g* and the second light emitting area PXA2*g*.

A second width WD-2*g* between the second light emitting area PXA2*g* and the third light emitting area PXA3*g* may be within a range from about 27 μm to about 28 μm.

The first light emitting area PXA1*g* may be provided in plural, and a third width WD-3*g* between two first light emitting areas PXA1*g* adjacent to each other may be within a range from about 44 μm to about 45 μm.

A plurality of patterns PTg may be disposed between the first light emitting area PXA1*g*, the second light emitting area PXA2*g*, and the third light emitting area PXA3*g*. Each of the patterns PTg may extend (e.g., may have a length) in a direction crossing a folding axis AX1 (refer to FIG. 1A). Each of the patterns PTg may extend in the first cross direction DRa or the second cross direction DRb.

According to the present disclosure, the patterns PTg may prevent or reduce an encapsulation layer 140 (refer to FIG. 4) from being separated by an external force. Accordingly, a reliability of an electronic device 1000 (refer to FIG. 1A) may be improved.

Figure 11H:
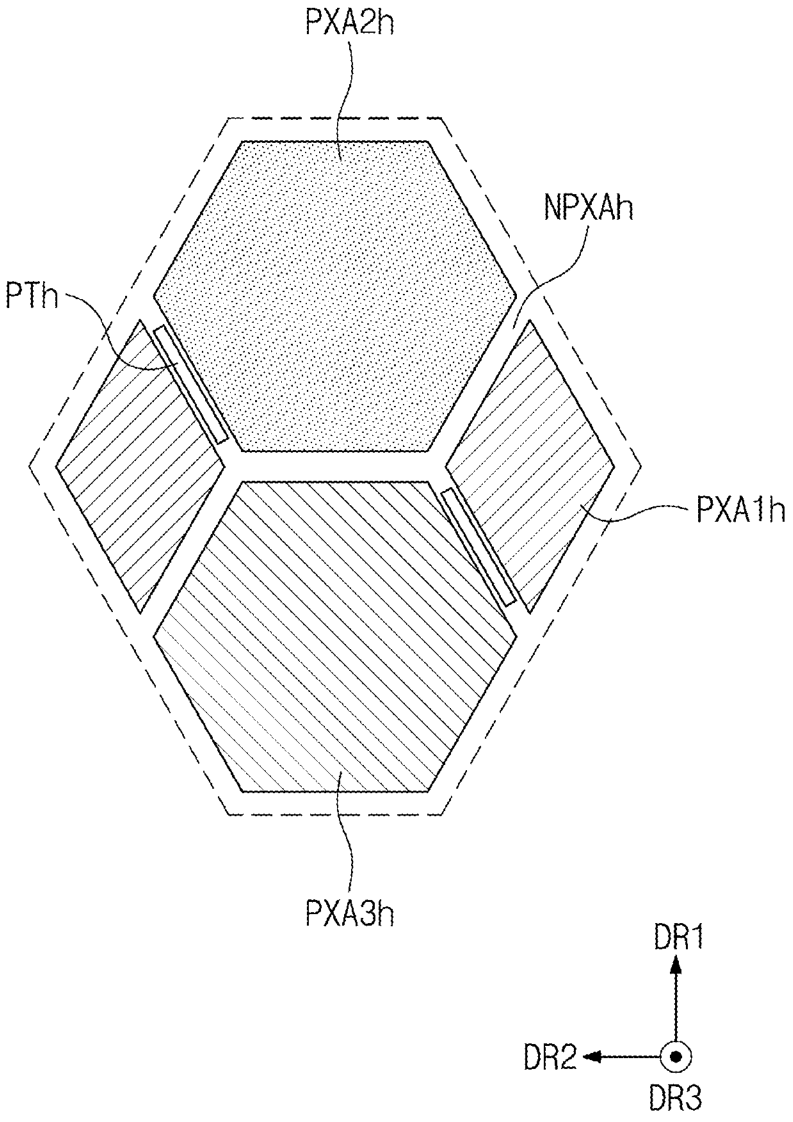

FIG. 11H is a plan view of an area corresponding to the area AA' of FIG. 1A according to an embodiment of the present disclosure. In FIG. 11H, the same reference numerals denote the same elements in FIG. 5, and thus, detailed descriptions of the same elements will not be provided.

Referring to FIG. 11H, a display panel DP (refer to FIG. 4) may include a first light emitting area PXA1*h*, a second light emitting area PXA2*h*, a third light emitting area PXA3*h*, and a non-light-emitting area NPXAh. The display panel DP (refer to FIG. 4) may provide a first color light through the first light emitting area PXA1*h*, may provide a second color light through the second light emitting area PXA2*h*, and may provide a third color light through the third light emitting area PXA3*h*. The first color light, the second color light, and the third color light may have different colors from each other. For example, the first color light may be a green light, the second color light may be a blue light, and the third color light may be a red light.

The first light emitting area PXA1*h* may have a lozenge shape, and each of the second light emitting area PXA2*h* and the third light emitting area PXA3*h* may have a hexagonal shape.

The first light emitting area PXA1*h* may be provided in plural. Two first light emitting areas PXA1*h* may be spaced apart from each other in the second direction DR2. The second light emitting area PXA2*h* and the third light emitting area PXA3*h* may be disposed between the two first light emitting areas PXA1*h*. The second light emitting area PXA2*h* and the third light emitting area PXA3*h* may be spaced apart from each other in the first direction DR1.

A plurality of patterns PTh may be disposed between the first light emitting area PXA1*h* and the second light emitting area PXA2*h* and between the first light emitting area PXA1*h* and the third light emitting area PXA3*h*. Each of the patterns PTh may extend (e.g., may have a length) in a direction crossing a folding axis AX1 (refer to FIG. 1A).

According to the present disclosure, the patterns PTh may prevent or reduce an encapsulation layer 140 (refer to FIG. 4) from being separated by an external force. Accordingly, a reliability of an electronic device 1000 (refer to FIG. 1A) may be improved.

Figure 12A:
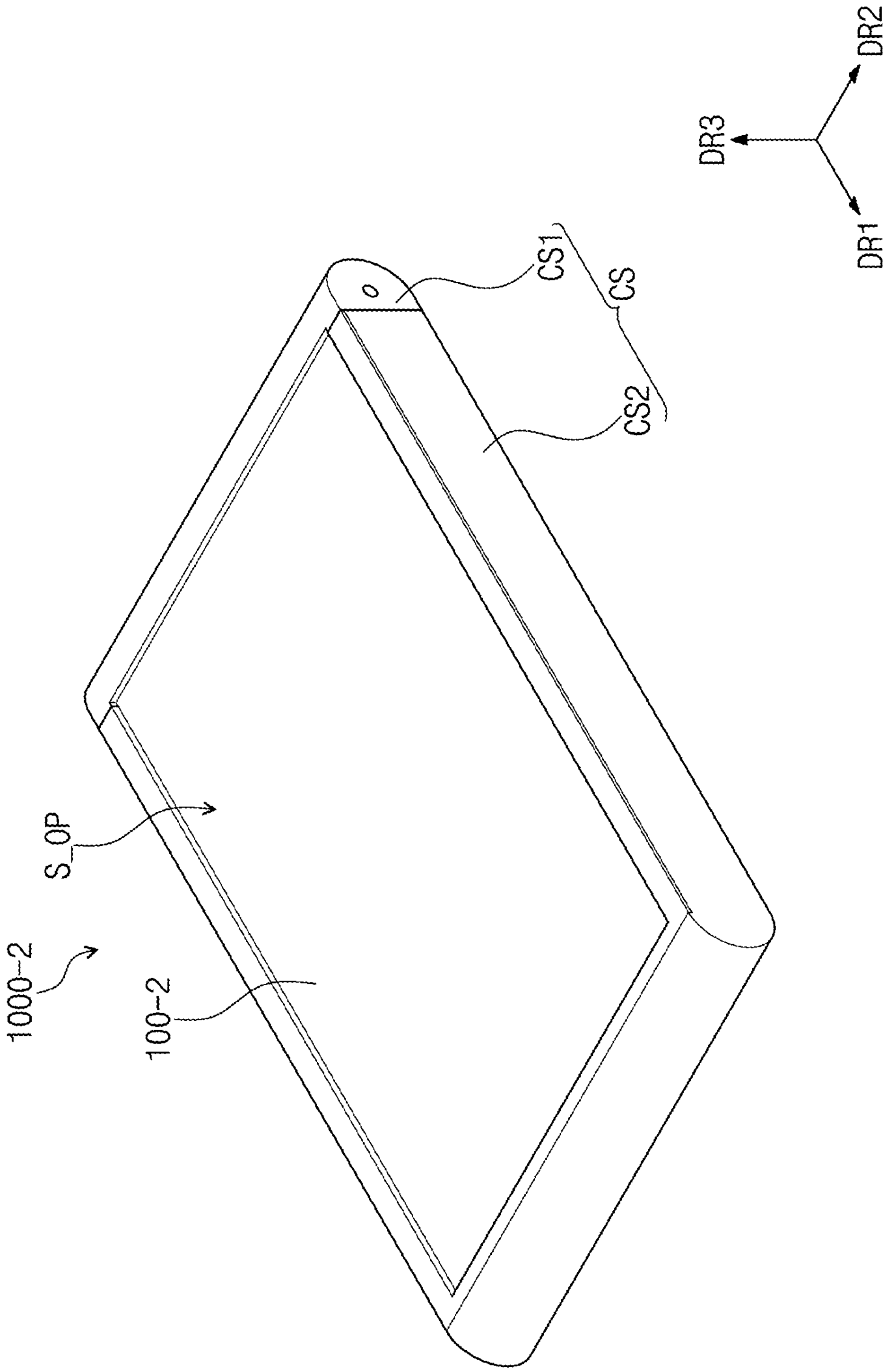
FIG. 12A is a perspective view of an electronic device according to an embodiment of the present disclosure.
Figure 12B:
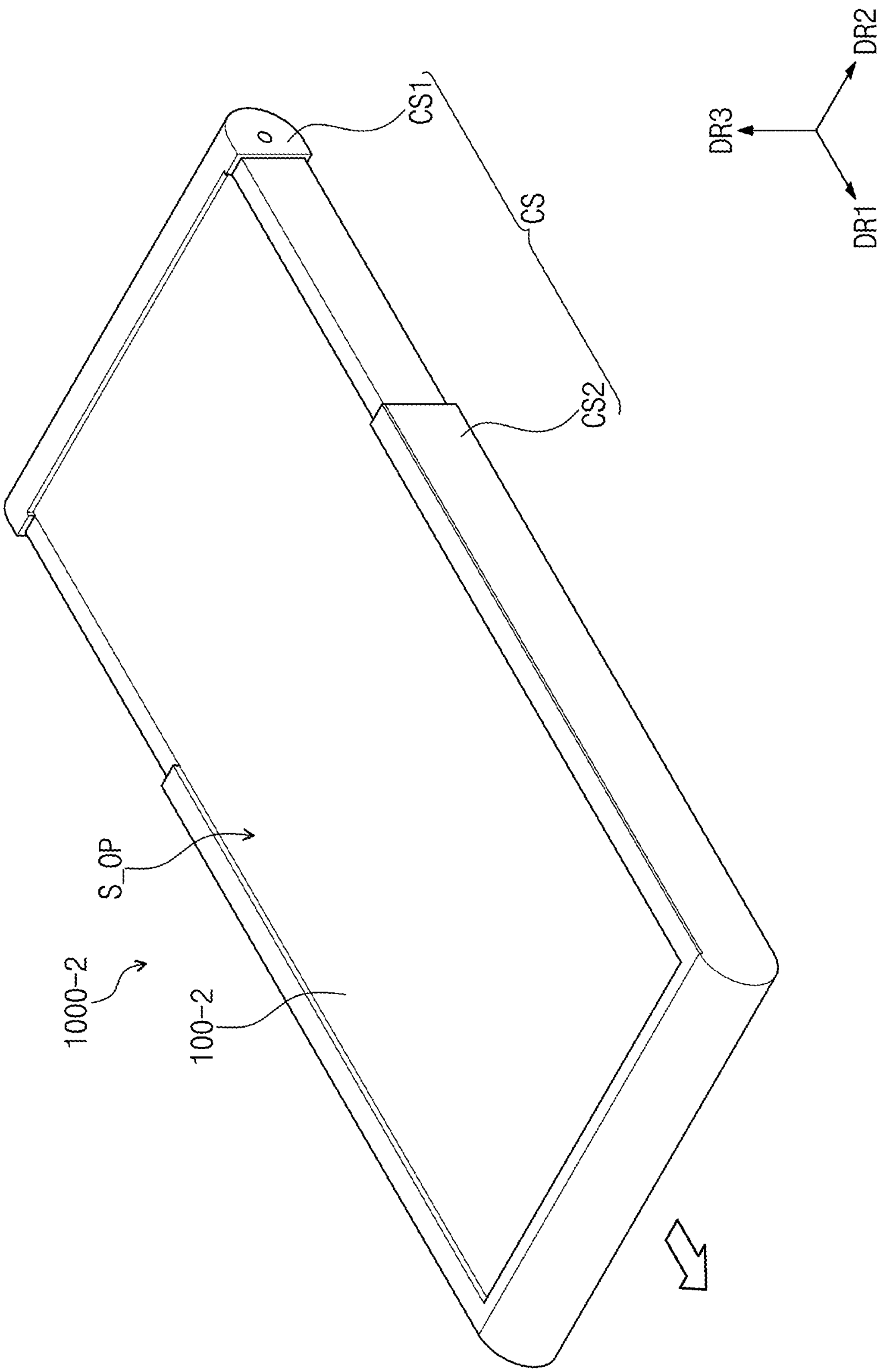
FIG. 12B is a view of an expansion mode of the electronic device shown in FIG. 12A according to an embodiment of the present disclosure.
Figure 12C:
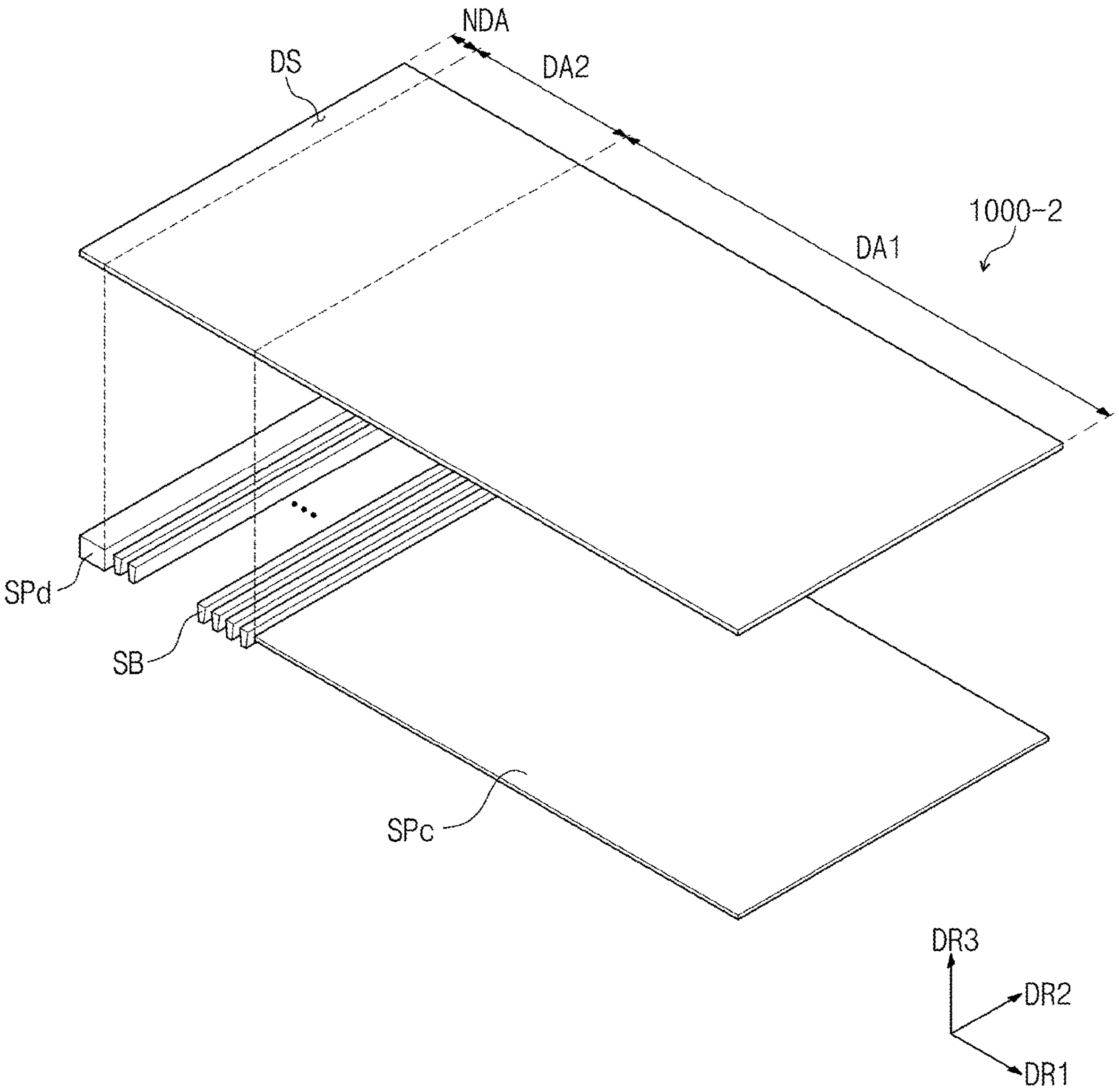
FIG. 12C is a perspective view of the electronic device shown in FIG. 12A according to an embodiment of the present disclosure.

FIG. 12A is a perspective view of an electronic device 1000-2 according to an embodiment of the present disclosure, FIG. 12B is a view of an expansion mode of the electronic device 1000-2 shown in FIG. 12A according to an embodiment of the present disclosure, and FIG. 12C is a perspective view of the electronic device 1000-2 shown in FIG. 12A according to an embodiment of the present disclosure.

Referring to FIGS. 12A to 12C, the electronic device 1000-2 may include a display module 100-2 and a case CS in which the display module 100-2 is accommodated. The display module 100-2 may be exposed to the outside through a display opening S_OP defined through an upper portion of the case CS.

The case CS may include a first case CS1 and a second case CS2. The first case CS1 and the second case CS2 may be coupled to each other to accommodate the display module 100-2. The second case CS2 may be coupled to the first case CS1 to move in a first direction DR1.

An area of an exposed surface of the display module 100-2 may be adjusted by the movement of the second case CS2. As an example, the display module 100-2 may be a flexible display module and may be supported by support plates SPc, SPd, and SB disposed under the display module 100-2. The support plates SPc, SPd, and SB may be connected to the first and second cases CS1 and CS2, and when the second case CS2 moves in the first direction DR1, the support plates SPc, SPd, and SB may also move in the first direction DR1.

In some embodiments, a portion of the display module 100-2 that is not exposed to the outside may be disposed in the first case CS1 except a portion of the display module DM exposed through the display opening S_OP, i.e., a display surface. As the second case CS2 moves, a size of the display opening S_OP may increase in the first direction DR1. In some embodiments, the display module 100-2 disposed on the support plates SPc, SPd, and SB may move in the first direction DR1 together with the support plates SPc, SPd, and SB due to the movement of the second case CS2, and thus, the exposed surface of the display module 100-2 exposed through the display opening S_OP may be expanded. Accordingly, the user may view the image through a larger screen.

The display surface DS of the display module 100-2 may include a first display area DA1, a second display area DA2, and a non-display area NDA. The first display area DA1 of the display surface DS may be provided in a size corresponding to the display opening S_OP in a basic mode to determine a screen size in the basic mode. For example, in the basic mode, the first display area DA1 of the display surface DS may be exposed through the display opening S_OP, and the second display area DA2 and the non-display area NDA may not be exposed through the display opening S_OP. According to an embodiment, the first display area DA1 and a portion of the second display area DA2 may be exposed through the display opening S_OP in the basic mode.

The second display area DA2 may be defined adjacent to the first display area DA1, and when the electronic device 1000-2 is operated in an expansion mode, a portion of the second display area DA2 may be exposed through the display opening S_OP as well as the first display area DA1. For example, the screen size of the electronic device 1000-2 may increase by the exposed portion of the second display area DA2.

The non-display area NDA may be defined adjacent to the second display area DA2. For example, the second display area DA2 may be defined between the first display area DA1 and the non-display area NDA. The non-display area NDA may be a non-effective area that is not used as the screen of the electronic device 1000-2.

The support plates SPc, SPd, and SB may be disposed under the display module 100-2. The support plates SPc, SPd, and SB disposed under the display module 100-2 may support the display module 100-2. The support plates SPc, SPd, and SB may be disposed on a rear surface of the display module 100-2, which is opposite to the display surface DS. The support plates SPc, SPd, and SB may include a first support plate SPc, a second support plate SPd, and a plurality of support bars SB.

The first support plate SPc may have a plate shape substantially parallel to a plane defined by the first and second directions DR1 and DR2. The first support plate SPc may be provided in a size corresponding to the first display area DA1 of the display module 100-2. The first support plate SPc may be disposed on the rear surface opposite to the display surface DS of the display module 100-2 and may support the first display area DA1 of the display module 100-2. The second support plate SPd may extend in the second direction DR2. The second support plate SPd may have a rectangular shape defined by long sides extending in the second direction DR2 and short sides extending in the first direction DR1. The second support plate SPd may be provided in a size corresponding to the non-display area NDA of the display module 100-2. The support bars SB and the second support plate SPd may be disposed on the rear surface of the display module 100-2 and may support the second display area DA2 and the non-display area NDA, respectively.

In the basic mode, the display module 100-2 of the second display area DA2 may be disposed on the rear surface of the first support plate SPc after being bent. For example, the first display area DA1 may be defined as a non-bending area, and all or a portion of the second display area DA2 may be defined as a bending area. The first support plate SPc may be disposed to correspond to the non-bending area, and the support bars SB may be disposed to correspond to the bending area.

The support bars SB may be disposed between the first support plate SPc and the second support plate SPd. The support bars SB may extend in the second direction DR2 and may be arranged in the first direction DR1. The support bars SB may be spaced apart from each other in the first direction DR1. When viewed in the second direction DR2, each of the support bars SB may have an inverted trapezoid shape with respect to the display surface DS of the display module 100-2.

For example, the support bars SB spaced apart from each other in the first direction DR1 are shown, however, the structure of the support bars SB should not be limited thereto or thereby. For example, the support bars SB may also be implemented as joint structures that are rotatably coupled to each other.

As used herein "at least one of a, b or c", "at least one selected from a, b and c", etc., may indicate only a, only b, only c, both (e.g., simultaneously) a and b, both (e.g., simultaneously) a and c, both (e.g., simultaneously) b and c, all of a, b, and c, or variations thereof. Further, the use of "may" when describing embodiments of the present invention refers to "one or more embodiments of the present invention."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Although the embodiments of the present disclosure have been described, it is understood that the present disclosure should not be limited to these embodiments but one or more suitable changes and modifications can be made by one ordinary skilled in the art within the spirit and scope of the present disclosure as hereinafter claimed. Therefore, the disclosed subject matter should not be limited to any single embodiment described herein, and the scope of the present disclosure shall be determined according to the attached claims, and equivalents thereof.

What is claimed is:

1. An electronic device comprising:
- a base layer;
- a plurality of first electrodes on the base layer;
- a pixel definition layer on the plurality of first electrodes and comprising a plurality of openings that expose portions of the plurality of first electrodes;
- a plurality of light emitting layers on the plurality of first electrodes;
- a plurality of patterns on the pixel definition layer;
- a second electrode on the plurality of light emitting layers; and
- an encapsulation layer on the plurality of patterns and the second electrode, wherein the plurality of patterns are between the plurality of light emitting layers when viewed in a thickness direction,
- wherein the encapsulation layer is directly on at least a portion of the plurality of patterns, and
- wherein an entire portion of the second electrode between the plurality of patterns is on the pixel definition layer.

2. The electronic device of claim 1, wherein each of the plurality of patterns has a width from about 3 micrometers to about 4 micrometers.

3. The electronic device of claim 1, wherein a gap between the plurality of patterns is within a range from about 1.5 micrometers to about 4.5 micrometers, and a thickness of each of the plurality of patterns is within a range from about 1 micrometer to about 2 micrometers.

4. The electronic device of claim 1, wherein the base layer comprises a first area in which a shape of the electronic device varies and a second area defined adjacent to the first area, and the plurality of patterns overlap the first area and do not overlap the second area in a plan view.

5. The electronic device of claim 1, wherein the base layer comprises a first area folded and unfolded with respect to a folding axis extending in a first direction and a second area defined adjacent to the first area, each of the plurality of patterns extends in a first cross direction crossing the first direction, and the plurality of patterns are spaced apart from each other in a second cross direction crossing the first cross direction.

6. The electronic device of claim 1, wherein the encapsulation layer covers the second electrode and the plurality of patterns.

7. The electronic device of claim 1, wherein each of the plurality of patterns has a reverse taper shape.

8. The electronic device of claim 1, wherein the second electrode comprises a first electrode portion and a plurality of second electrode portions, the first electrode portion is on the plurality of light emitting layers, the first electrode portion comprising a plurality of openings that do not overlap the plurality of patterns in a plan view, and the plurality of second electrode portions that overlap the plurality of openings in the plan view.

9. The electronic device of claim 1, further comprising a spacer between the plurality of patterns and the plurality of light emitting layers in plan view, wherein the spacer comprises a first portion and a second portion, and each of the first portion and the second portion has a width from about 9 micrometers to about 13 micrometers.

10. The electronic device of claim 9, wherein a gap between the first portion and the second portion is within a range from about 1.5 micrometers to about 4.5 micrometers.

11. The electronic device of claim 9, wherein each of the first portion and the second portion has a thickness from about 2.3 micrometers to about 3.3 micrometers.

12. An electronic device comprising:
- a base layer;
- a plurality of first electrodes on the base layer;
- a pixel definition layer on the plurality of first electrodes and comprising a plurality of openings that expose portions of the plurality of first electrodes;
- a plurality of light emitting layers on the plurality of first electrodes;
- a plurality of patterns on the pixel definition layer;
- a second electrode on the plurality of light emitting layers; and
- an encapsulation layer on the plurality of patterns and the second electrode, wherein the plurality of patterns are between the plurality of light emitting layers when viewed in a thickness direction,
- wherein the second electrode comprises:
- a first electrode portion on an upper surface of each of the plurality of patterns; and
- a second electrode portion spaced apart from the first electrode portion and on the plurality of light emitting layers, and
- wherein an entire portion of the second electrode between the plurality of patterns is on the pixel definition layer.

13. An electronic device comprising:

a base layer comprising a folding area to be folded or unfolded with respect to a folding axis extending in a first direction and a plurality of non-folding areas spaced apart from each other with the folding area interposed therebetween;

a circuit layer on the base layer and comprising a transistor and an insulating layer;

a light emitting element layer on the circuit layer and comprising a light emitting element comprising a first electrode, a light emitting layer, and a second electrode, a pixel definition layer, and a plurality of patterns on the pixel definition layer; and an encapsulation layer on the light emitting element layer, wherein the plurality of patterns overlap the folding area in a plan view, and each of the plurality of patterns has a thickness from about 1 micrometer to about 2 micrometers, wherein the encapsulation layer is directly on at least a portion of the plurality of patterns.

14. The electronic device of claim 13, wherein each of the plurality of patterns has a width from about 3 micrometers to about 4 micrometers in the plan view.

15. The electronic device of claim 13, wherein a gap between the plurality of patterns is within a range from about 1.5 micrometers to about 4.5 micrometers.

16. The electronic device of claim 13, wherein the plurality of patterns do not overlap the plurality of non-folding areas in the plan view.

17. The electronic device of claim 13, wherein each of the plurality of patterns extends in a first cross direction crossing the first direction, and the plurality of patterns are spaced apart from each other in a second cross direction crossing the first cross direction.

18. The electronic device of claim 13, wherein the encapsulation layer covers the second electrode and the plurality of patterns.

19. The electronic device of claim 13, wherein each of the plurality of patterns comprises a side surface spaced apart from the second electrode.

20. The electronic device of claim 13, wherein each of the plurality of patterns has a reverse taper shape.

* * * * *